(12) United States Patent
Nagano

(10) Patent No.: US 8,970,773 B2
(45) Date of Patent: Mar. 3, 2015

(54) IMAGE CAPTURE APPARATUS WITH FIRST AND SECOND PIXEL GROUPS

(75) Inventor: Akihiko Nagano, Ichihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 31 days.

(21) Appl. No.: 13/809,262

(22) PCT Filed: Jul. 14, 2011

(86) PCT No.: PCT/JP2011/066641
§ 371 (c)(1),
(2), (4) Date: Jan. 9, 2013

(87) PCT Pub. No.: WO2012/020632
PCT Pub. Date: Feb. 16, 2012

(65) Prior Publication Data
US 2013/0107086 A1 May 2, 2013

(30) Foreign Application Priority Data
Aug. 9, 2010 (JP) .................. 2010-179000

(51) Int. Cl.
| G03B 13/00 | (2006.01) |
| H04N 5/232 | (2006.01) |
| H04N 5/238 | (2006.01) |
| H01L 27/146 | (2006.01) |
| H04N 5/3745 | (2011.01) |

(52) U.S. Cl.
CPC .......... *H04N 5/238* (2013.01); *H01L 27/14607* (2013.01); *H01L 27/14621* (2013.01); *H01L 27/14623* (2013.01); *H01L 27/14627* (2013.01); *H01L 27/1463* (2013.01); *H04N 5/23212* (2013.01); *H04N 5/37457* (2013.01)
USPC .......................... 348/350; 348/345

(58) Field of Classification Search
USPC .......................... 348/345–357, 294–308, 272
See application file for complete search history.

(56) References Cited

U.S. PATENT DOCUMENTS

| 5,128,705 A | 7/1992 | Someya et al. |
| 5,422,700 A | 6/1995 | Suda et al. |
| 5,473,403 A | 12/1995 | Suda et al. |
| 5,692,222 A | 11/1997 | Yamada et al. |
| 5,696,998 A | 12/1997 | Yamada et al. |
| 6,819,360 B1 * | 11/2004 | Ide et al. ....................... 348/340 |
| 7,095,441 B2 * | 8/2006 | Nagano ......................... 348/308 |

(Continued)

FOREIGN PATENT DOCUMENTS

| JP | 63-127217 A | 5/1988 |
| JP | 2-120712 A | 5/1990 |

(Continued)

*Primary Examiner* — Tuan Ho
*Assistant Examiner* — Selam Gebriel
(74) *Attorney, Agent, or Firm* — Fitzpatrick, Cella, Harper & Scinto

(57) ABSTRACT

An image capture apparatus comprises an image sensor which photo-electrically converts an object image formed by an imaging lens, the image sensor including a first pixel group having a first light-receiving area, and a second pixel group which is discretely arranged in the first pixel group and configured by dividing a light-receiving area substantially equal in area to the first light-receiving area into a second light-receiving area and a third light-receiving area different in area from the second light-receiving area, and control means for integrally controlling the second light-receiving area of the second pixel group and the first light-receiving area of the first pixel group.

6 Claims, 15 Drawing Sheets

(56) References Cited

U.S. PATENT DOCUMENTS

| | | | |
|---|---|---|---|
| 8,305,483 B2* | 11/2012 | Fujii et al. | 348/345 |
| 8,576,329 B2* | 11/2013 | Takamiya | 348/350 |
| 2003/0086008 A1* | 5/2003 | Nagano | 348/272 |
| 2004/0004668 A1* | 1/2004 | Namazue et al. | 348/340 |
| 2007/0237512 A1* | 10/2007 | Kusaka | 396/111 |
| 2008/0317454 A1* | 12/2008 | Onuki | 396/128 |
| 2009/0122171 A1* | 5/2009 | Suzuki | 348/294 |
| 2009/0213255 A1* | 8/2009 | Suzuki | 348/302 |
| 2009/0266975 A1* | 10/2009 | Nagano | 250/208.1 |
| 2010/0214431 A1 | 8/2010 | Watanabe et al. | |
| 2011/0164166 A1* | 7/2011 | Oikawa | 348/340 |
| 2011/0169997 A1* | 7/2011 | Nagano et al. | 348/340 |
| 2011/0273602 A1* | 11/2011 | Takamiya et al. | 348/302 |
| 2012/0033128 A1* | 2/2012 | Nagano | 348/349 |
| 2012/0188425 A1* | 7/2012 | Kita | 348/294 |

FOREIGN PATENT DOCUMENTS

| | | |
|---|---|---|
| JP | 2007-184840 A | 7/2007 |
| JP | 2008-134390 A | 6/2008 |
| JP | 2009-103997 A | 5/2009 |

* cited by examiner

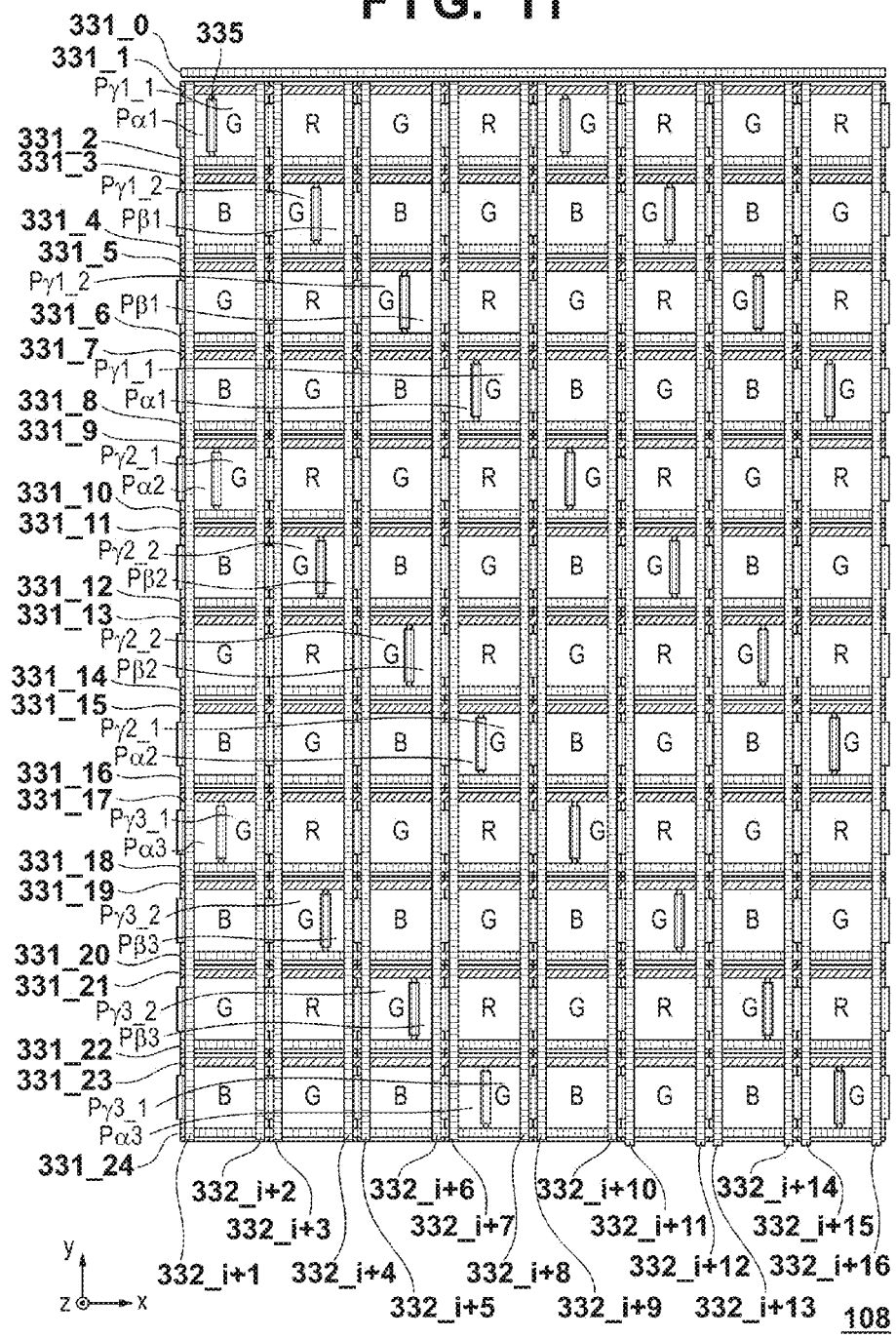

IMAGE CAPTURE APPARATUS WITH FIRST AND SECOND PIXEL GROUPS

TECHNICAL FIELD

The present invention relates to a technique of detecting the focus state of an imaging lens in an image capture apparatus such as a digital camera.

BACKGROUND ART

Focus detection methods conventionally used in digital cameras are, for example, a contrast detection method used in video cameras or compact cameras, and a phase-difference detection method used in single-lens reflex cameras.

A phase-difference detection type focus detection method adopted in single-lens reflex cameras is disclosed in, for example, Japanese Patent Laid-Open No. 2-120712. A single-lens reflex camera includes a quick return mirror to guide object light to a viewfinder optical system so that the user can observe the object via an imaging lens. The quick return mirror is formed from a half mirror which transmits part of light. Light having passed through the quick return mirror is guided to a phase-difference detection type focus detection device to detect the focus of the imaging lens. In photographing with a photosensitive medium such as a film or image sensor, the quick return mirror retracts from the photographic optical path. During photographing with a photosensitive medium, no conventional phase-difference detection type focus detection can be done.

A contrast detection type focus adjustment method is generally used to observe or record a moving image in a camera having an image sensor as a photosensitive medium. For example, Japanese Patent Laid-Open No. 63-127217 discloses the focus detection method. According to the contrast detection type focus adjustment method, while moving the focus lens of an imaging lens along the optical axis, the high-frequency component of an image sensed by an image sensor is extracted. A lens position where the contrast peaks is detected to adjust the focus. This focus adjustment method compares the contrasts of images while moving the focus lens, and cannot adjust the focus quickly.

Under the circumstances, the present applicant has applied Japanese Patent Laid-Open No. 2009-103997 which discloses a technique capable of phase difference-based focus detection by restricting a light-receivable area in some pixels forming an image sensor.

In the technique disclosed in Japanese Patent Laid-Open No. 2009-103997, some pixels of the image sensor are dedicated to focus detection. In a normal captured image, the focus detection pixels become defective pixels, degrading the image quality.

SUMMARY OF INVENTION

The present invention has been made to solve the above problems, and suppresses degradation of the image quality while quickly adjusting the focus with high precision even during moving image capturing in an image capture apparatus.

According to the present invention, there is provided an image capture apparatus comprising: an image sensor which photo-electrically converts an object image formed by an imaging lens, the image sensor including a first pixel group having a first light-receiving area, and a second pixel group which is discretely arranged in the first pixel group and configured by dividing a light-receiving area substantially equal in area to the first light-receiving area into a second light-receiving area and a third light-receiving area different in area from the second light-receiving area; and control means for integrally controlling the second light-receiving area of the second pixel group and the first light-receiving area of the first pixel group.

Further features of the present invention will become apparent from the following description of exemplary embodiments with reference to the attached drawings.

BRIEF DESCRIPTION OF DRAWINGS

FIG. 11 is a partial plan view showing the image sensor;

DESCRIPTION OF EMBODIMENTS

First Embodiment

Figure 1:
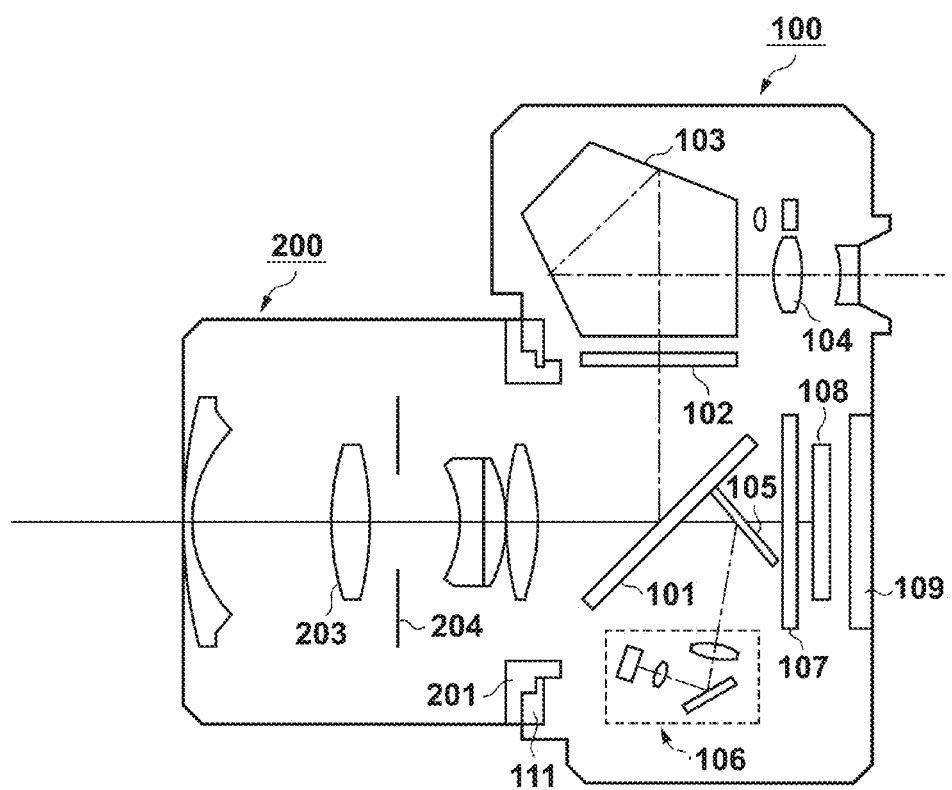
FIG. 1 is a view showing the arrangement of a camera as an image capture apparatus according to the first embodiment of the present invention.
Figure 2:
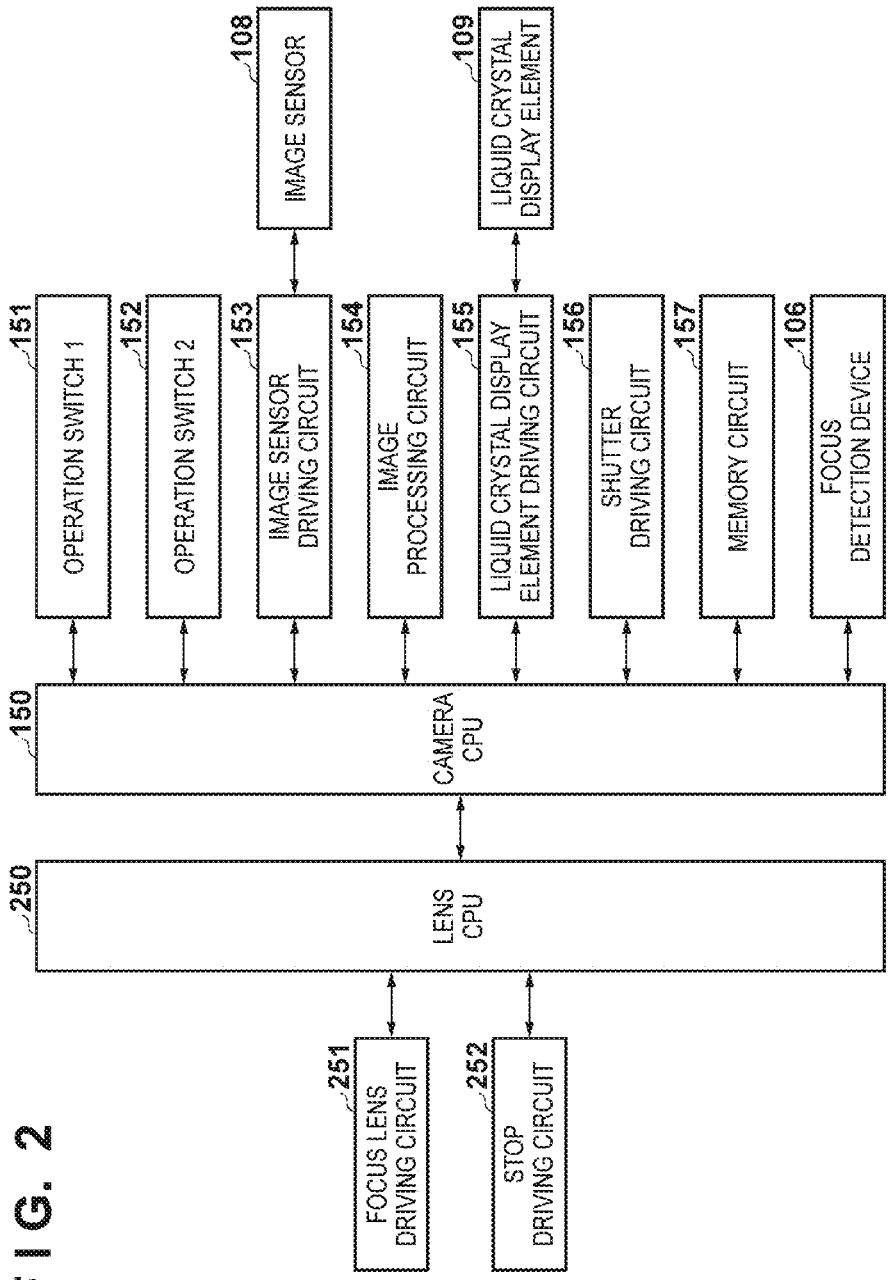
FIG. 2 is a block diagram showing the electrical circuit of the camera according to the first embodiment.
Figure 3:
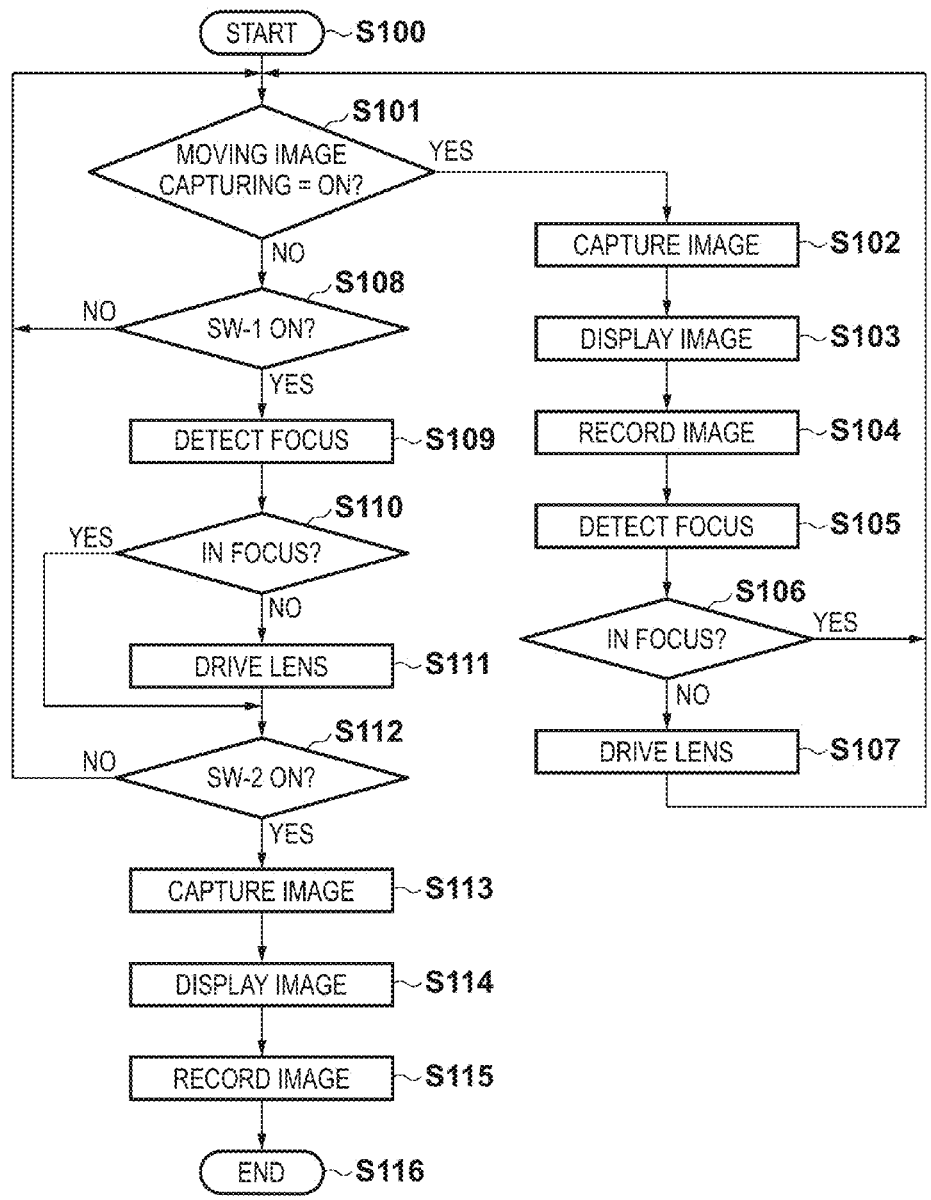
FIG. 3 is a flowchart showing a camera operation according to the first embodiment.
Figure 4A:
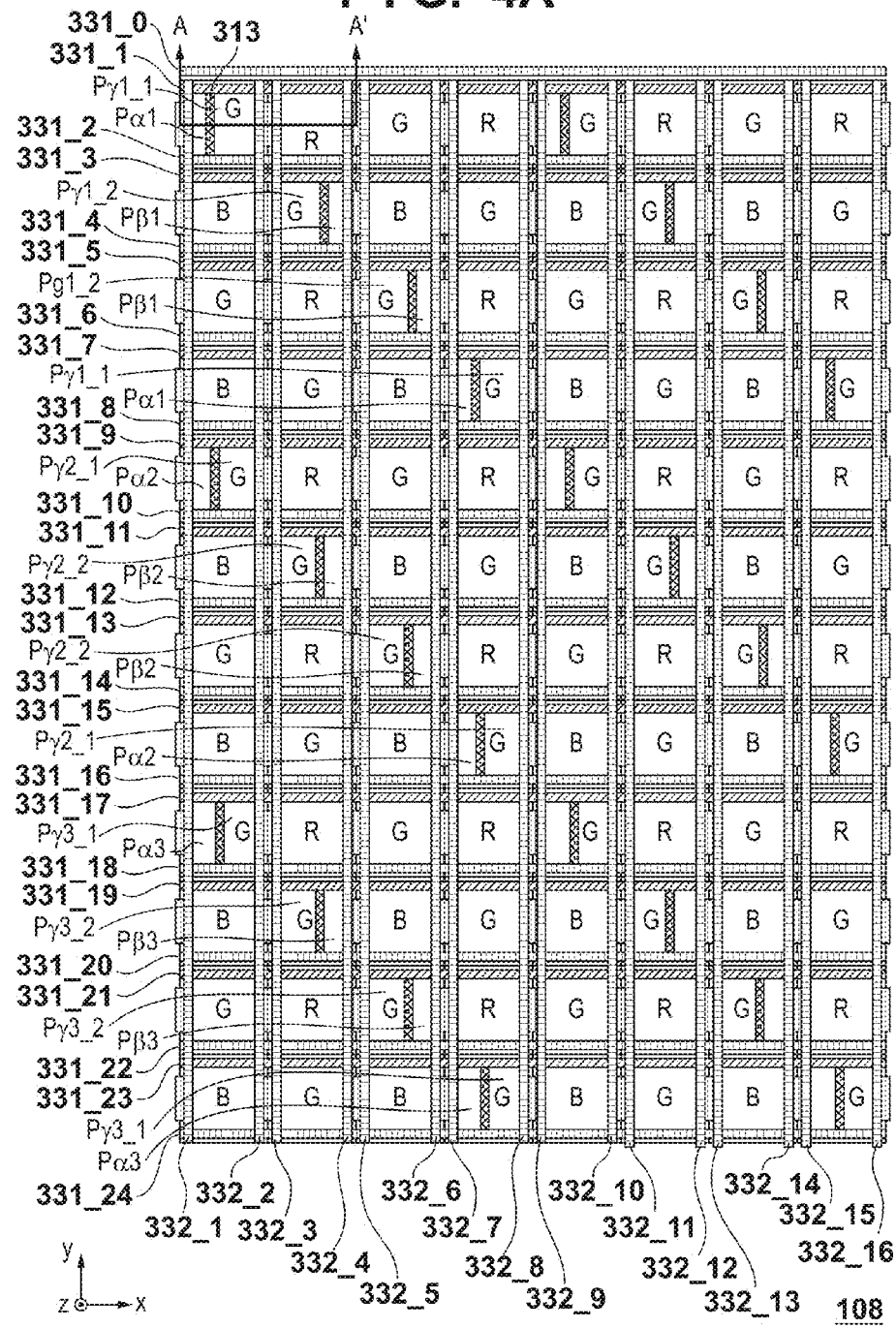
FIG. 4A is a partial plan view showing an image sensor.
Figure 4B:
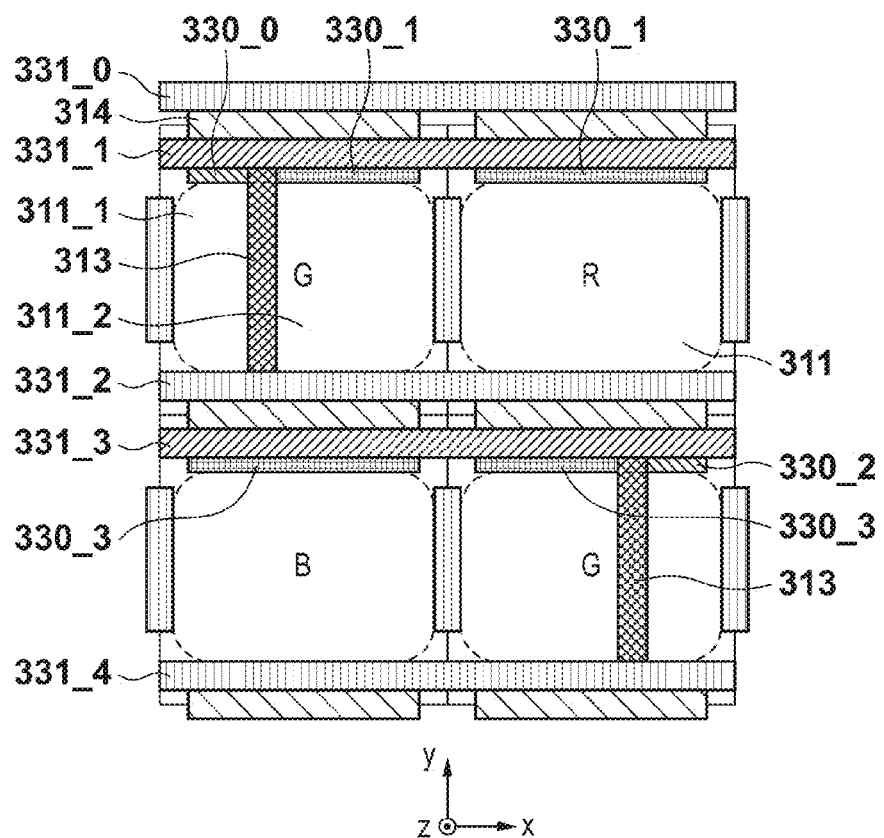
FIG. 4B is a partial plan view showing the image sensor.
Figure 5:
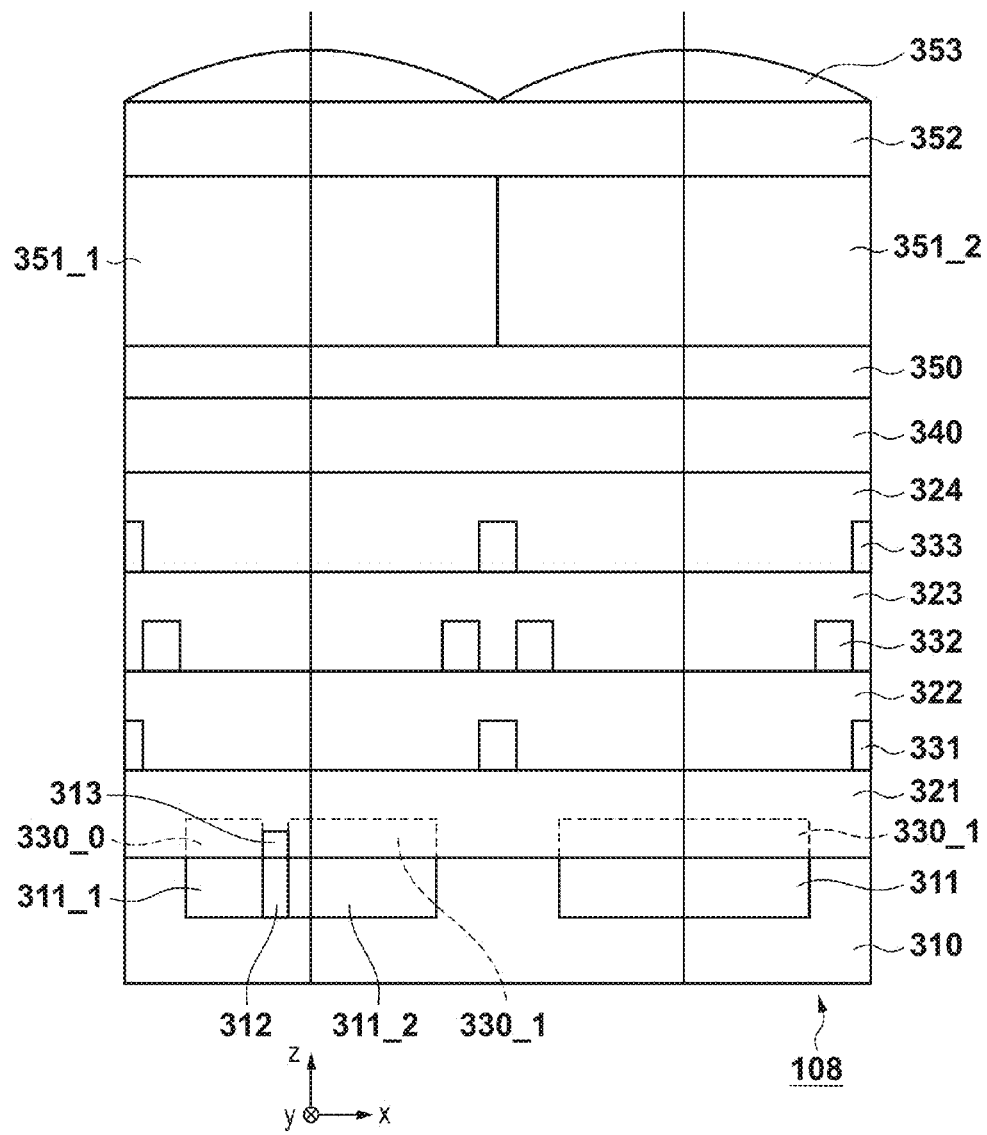
FIG. 5 is a partial sectional view showing the image sensor.
Figure 6A:
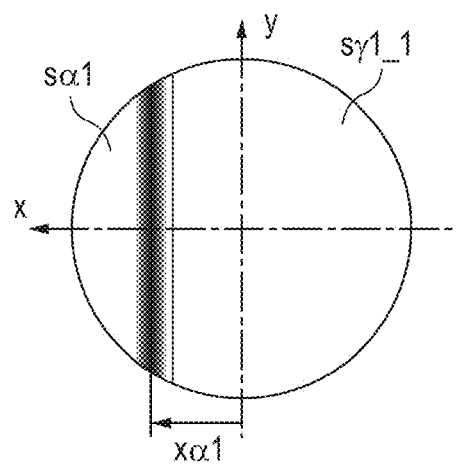
FIGS. 6A to 6F are views for explaining the light-receiving distribution of the image sensor.
Figure 6B:
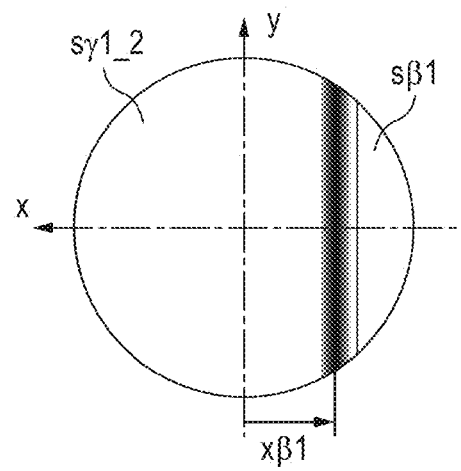
Figure 6C:
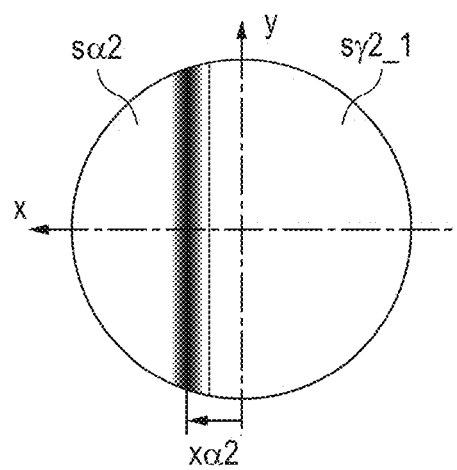
Figure 6D:
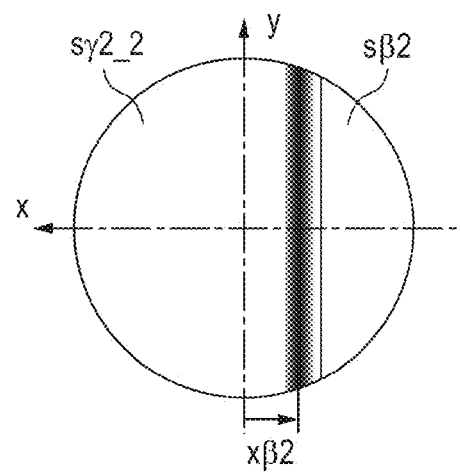
Figure 6E:
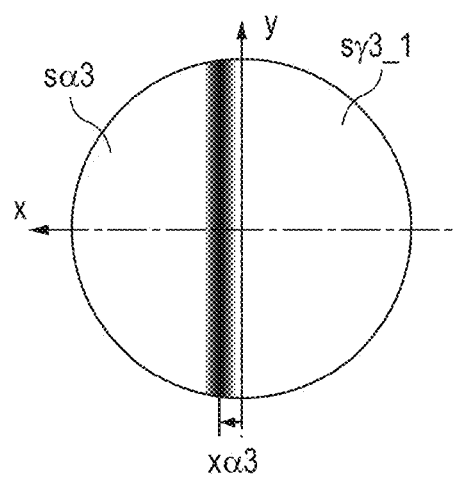
Figure 6F:
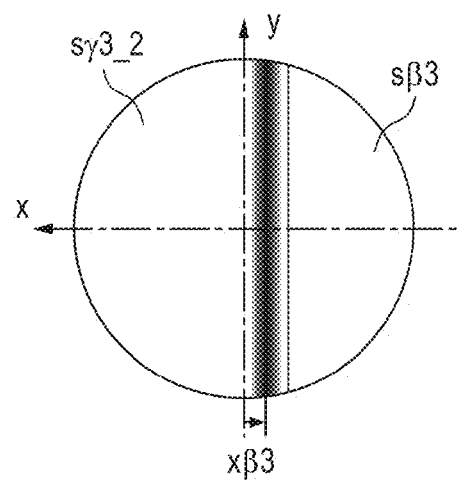
Figure 7A:
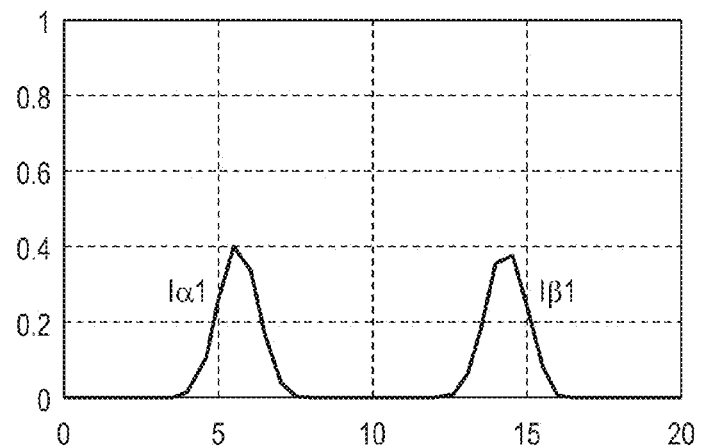
FIGS. 7A to 7C are graphs for explaining a line image obtained from the second pixel.
Figure 7B:
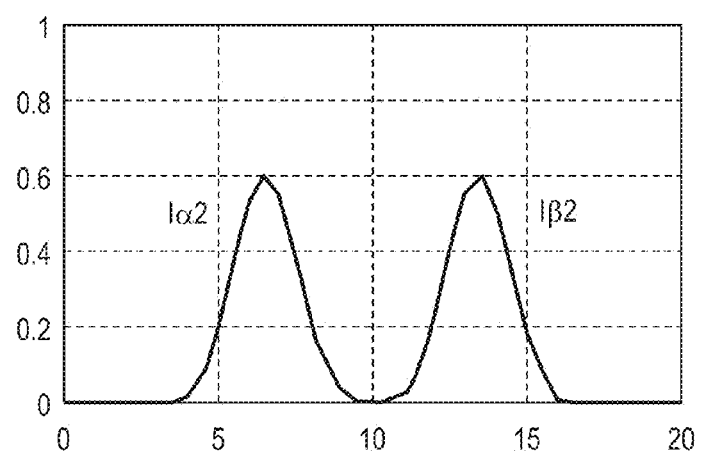
Figure 7C:
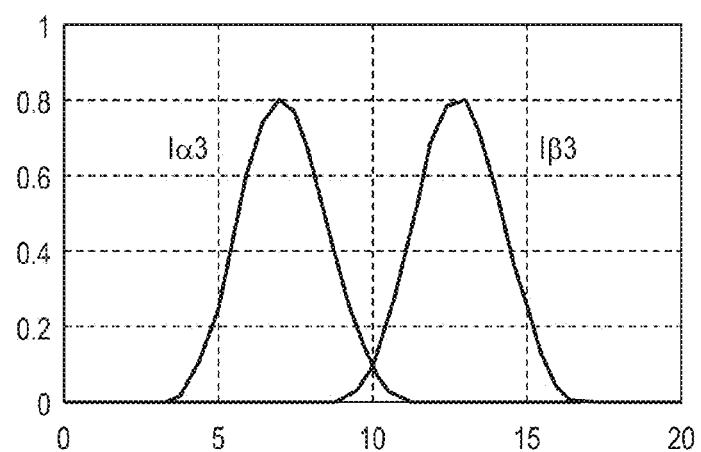
Figure 8:
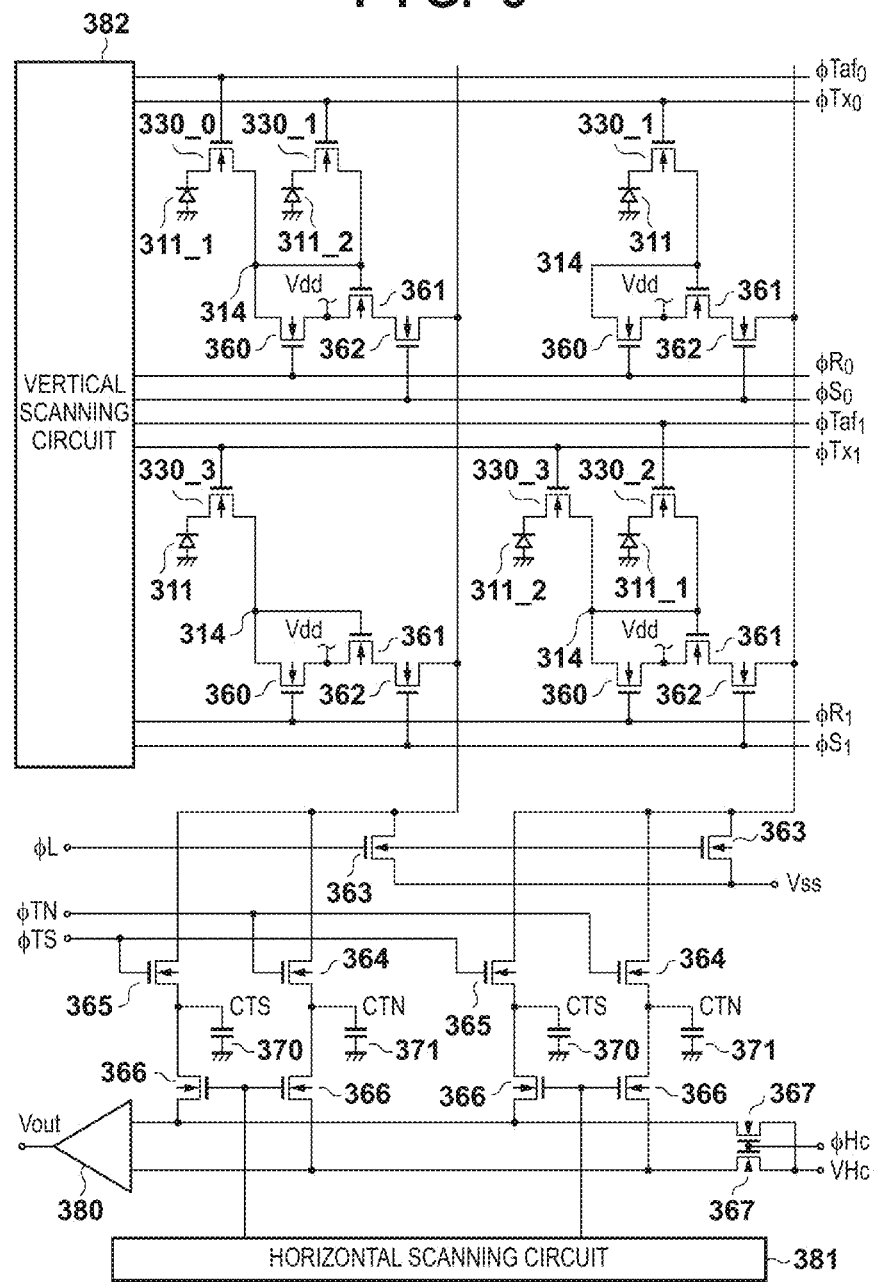
FIG. 8 is a circuit diagram showing part of the image sensor.
Figure 9A:
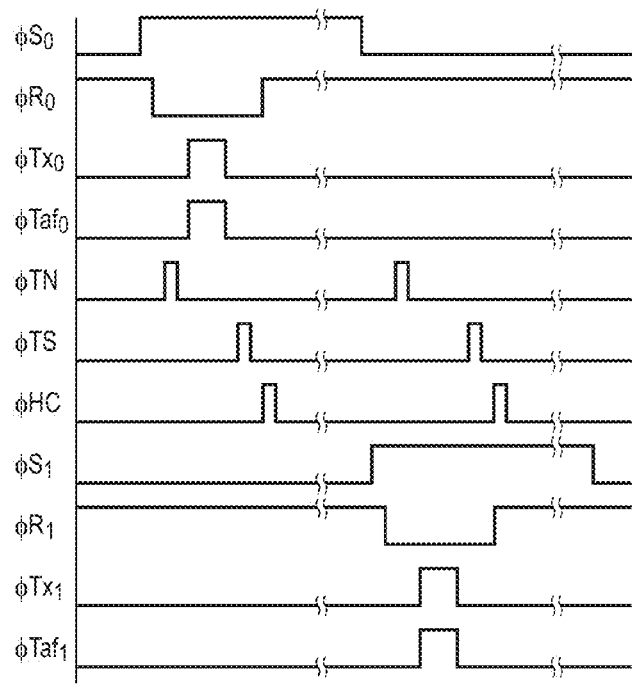
FIG. 9A is a timing chart showing the operation of the image sensor.
Figure 9B:
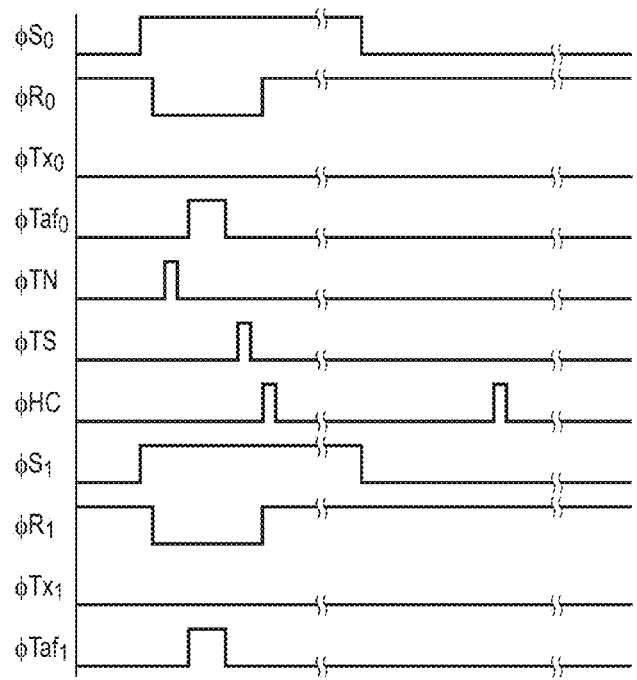
FIG. 9B is a timing chart showing the operation of the image sensor.
Figure 9C:
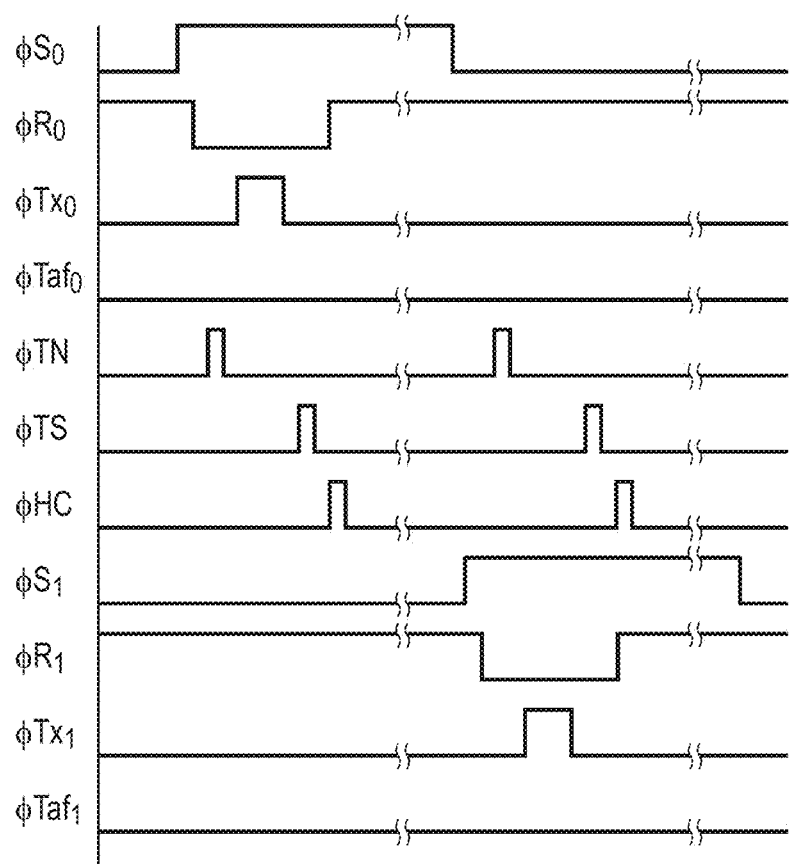
FIG. 9C is a timing chart showing the operation of the image sensor.

FIGS. 1 to 9C are views showing an image capture apparatus according to the first embodiment of the present invention. FIG. 1 is a view showing the arrangement of a digital camera as the image capture apparatus according to the embodiment. FIG. 2 is a block diagram showing the electrical circuit of the camera. FIG. 3 is a flowchart showing a camera operation. FIGS. 4A and 4B are partial plan views showing a CMOS image sensor according to the embodiment. FIG. 5 is a partial sectional view showing the image sensor. FIGS. 6A to 6F are views for explaining the light-receiving distribution of the image sensor. FIGS. 7A to 7C are graphs for explaining a line image. FIG. 8 is a circuit diagram showing part of the image sensor. FIGS. 9A, 9B, and 9C are timing charts showing driving of the image sensor.

In the camera arrangement view of FIG. 1, the digital camera according to the embodiment is a single-lens reflex digital camera in which an imaging lens 200 is detachable from a camera body 100 via a camera side mount 111 and lens side mount 201.

The imaging lens 200 is formed from a plurality of lens units (for example, a lens 203) and a stop 204. Object light (object image) having passed through the imaging lens 200 is reflected by a quick return mirror 101 of the camera body 100 and converged to the vicinity of a focusing screen 102. The object light which has been diffused and transmitted by the focusing screen 102 is guided to the user's eye (not shown) via a roof pentaprism 103 and eyepiece lens 104.

The quick return mirror 101 is a half mirror. Partial object light having passed through the quick return mirror 101 is reflected by a sub-mirror 105 and guided to a focus detection device 106. The focus detection device 106 adopts a known arrangement in which the focus state of the imaging lens 200 is detected from two images generated by light components having passed through different pupil areas of the imaging lens 200. An image sensor 108 according to the embodiment is arranged on the prospective imaging plane of the imaging lens 200.

The camera of the embodiment can capture a moving image. In moving image capturing, the quick return mirror 101 and sub-mirror 105 retract from the photographic optical path, and a shutter 107 is opened. At this time, an image sensed by the image sensor 108 can be observed on a liquid crystal display element 109.

A camera operation will be explained with reference to the block diagram of the electrical circuit of the camera of FIG. 2 and the flowchart of FIG. 3.

In the flowchart of FIG. 3, the power supply (not shown) of the camera body 100 is turned on (step S100). Then, a camera CPU 150 which controls the camera body 100 checks the state of an operation switch 151 used to designate moving image capturing (step S101). If the operation switch 151 is ON to designate moving image capturing (YES in step S101), the camera CPU 150 retracts the quick return mirror 101 and sub-mirror 105 from the photographic optical path, and opens the shutter 107 via a shutter driving circuit 156.

Upon completion of capturing preparations, the camera CPU 150 drives the image sensor 108 via an image sensor driving circuit 153 to photograph an object (step S102). An image processing circuit 154 processes the image sensed by the image sensor 108 into a display image, and the liquid crystal display element 109 displays it via a liquid crystal display element driving circuit 155 (step S103). Further, the image processing circuit 154 processes the image into a recording image, and a memory circuit 157 records it (step S104). At this time, the image may be recorded on a recording medium.

The image processing circuit 154 detects the focus state of the imaging lens 200 based on the image sensed by the image sensor 108 (step S105). A focus detection method using the image sensor 108 of the embodiment will be described later.

If the imaging lens 200 is out of focus (NO in step S106), the camera CPU 150 transmits, to a lens CPU 250, the defocus amount of the imaging lens 200 that has been detected by the image processing circuit 154. The lens CPU 250 converts the defocus amount of the imaging lens 200 into a step driving amount of the focus lens, and transmits a signal to a focus lens driving circuit 251 to drive the focus lens (step S107).

Subsequently, the camera CPU 150 checks the state of the operation switch 151 used to designate moving image capturing. If the operation switch 151 is ON (YES in step S101), the camera CPU 150 continues moving image capturing (step S102).

If the operation switch 151 used to designate moving image capturing is OFF (NO in step S101), the camera CPU 150 checks the state of an operation switch 152 used to designate still image capturing (step S108). If the user has not executed a pre-operation SW-1 for still image capturing with the operation switch 152, the camera CPU 150 waits.

If the user executes the pre-operation SW-1 for still image capturing with the operation switch 152, the camera CPU 150 detects the focus state of the imaging lens 200 based on an output from the focus detection device 106 (step S109). A focus detection method in still image capturing is a known technique.

If the imaging lens 200 is in focus (YES in step S110), the camera CPU 150 checks the state of the operation switch 152 used to designate still image capturing (step S112). If the imaging lens 200 is out of focus (NO in step S110), the camera CPU 150 transmits a detected defocus amount of the imaging lens 200 to the lens CPU 250. The lens CPU 250 converts the defocus amount of the imaging lens 200 into a step driving amount of the focus lens, and transmits a signal to the focus lens driving circuit 251 to drive the focus lens (step S111).

Then, the camera CPU 150 checks the state of the operation switch 152 used to designate still image capturing (step S112). If the user has not executed a post-operation SW-2 for still image capturing with the operation switch 152, the camera CPU 150 waits.

If the user has executed the post-operation SW-2 for still image capturing with the operation switch 152 (YES in step S112), the camera CPU 150 retracts the quick return mirror 101 and sub-mirror 105 from the photographic optical path, and opens the shutter 107 via the shutter driving circuit 156. Upon completion of preparations for still image capturing, the camera CPU 150 controls the image sensor 108 via the image sensor driving circuit 153 to sense the object (step S113). The image processing circuit 154 processes the image sensed by the image sensor 108 into a display image, and the liquid crystal display element 109 displays it via the liquid crystal display element driving circuit 155 (step S114). Further, the image processing circuit 154 processes the image into a recording image, and the memory circuit 157 records it (step S115). At this time, the image may be recorded on a recording medium.

After the end of recording the image (step S115), a series of capturing operations of the camera ends (step S116).

The arrangement of the image sensor 108 according to the embodiment will be explained. FIGS. 4A and 4B are partial plan views showing the image sensor 108. FIG. 5 is a partial sectional view showing the image sensor 108. FIGS. 6A to 6F are views for explaining the light-receiving distribution of the image sensor 108. FIGS. 7A to 7C are graphs for explaining a line image.

FIG. 5 is a sectional view taken along the line A-A' shown in the partial plan view of the image sensor 108 of FIG. 4A. In the image sensor 108, a photo-electric conversion portion 311 is formed in a silicon substrate 310. Signal charges generated by the photo-electric conversion portion 311 are transferred to a floating diffusion portion (not shown) via a transfer electrode 330. Signal charges in the floating diffusion portion are output to the outside via a corresponding first electrode 331 and second electrode 332. An interlayer dielectric film 321 is formed between the photo-electric conversion portions 311 and the electrodes 331. An interlayer dielectric film 322 is formed between the electrodes 331 and the electrodes 332. Further, an interlayer dielectric film 323 is formed between the electrodes 332 and electrodes 333.

An interlayer dielectric film 324 is formed on the light incident side of the electrodes 333, and a passivation film 340 and planarization layer 350 are formed on the interlayer dielectric film 324. A color filter layer 351, a planarization layer 352, and microlenses 353 are formed on the light incident side of the planarization layer 350. The power of the microlens 353 is set so that the pupil of the imaging lens 200 and the photo-electric conversion portion 311 become almost conjugate to each other.

FIG. 5 is a sectional view showing pixels positioned at the center of the image sensor 108. The microlens 353 is arranged at almost the center of the pixel. Object light that passes through the imaging lens 200 converges to the vicinity of the image sensor 108 that is arranged on the prospective imaging plane of the camera body 100. The light which has reached each pixel of the image sensor 108 is refracted by the microlens 353 and condensed to the photo-electric conversion portion 311. The electrodes 331, 332, and 333 stacked along the optical axis of the image sensor 108 are disposed not to cut off incident light.

A pixel on the right side of FIG. 5 is the first pixel (forming the first pixel group) used in normal capturing, and the photo-electric conversion portion 311 (first light-receiving area) is formed to be able to receive light in the entire pupil area of the imaging lens 200. To the contrary, a pixel on the left side of FIG. 5 is the second pixel (forming the second pixel group) used in normal capturing and also used to detect the focus state of the imaging lens 200. The photo-electric conversion portion of the pixel on the left side of FIG. 5 includes an isolation portion 312 where an impurity opposite in polarity to the photo-electric conversion portion is diffused. The isolation portion 312 divides the photo-electric conversion portion into a smaller-area photo-electric conversion portion 311_1 (second light-receiving area) and a larger-area photo-electric conversion portion 311_2 (third light-receiving area) having a center at a position deviated from the optical axis of the microlens. The photo-electric conversion portions 311_1 and 311_2 can receive a beam having passed through part of the pupil of the imaging lens 200. The focus state of the imaging lens 200 is detected using an output from either the photo-electric conversion portion 311_1 or 311_2.

The photo-electric conversion portion of the pixel on the left side of FIG. 5 has almost the same area as that of the photo-electric conversion portion 311 of the pixel on the right side of FIG. 5. The sum of outputs from the photo-electric conversion portions 311_1 and 311_2 substantially equals an output from the photo-electric conversion portion 311 of the pixel on the right side of FIG. 5. A light-shielding portion 313 is arranged on the light incident side of the isolation portion 312 to cut off incident light.

The pixel arrangement of the image sensor 108 will be explained with reference to the plan views of FIGS. 4A and 4B. Referring to FIGS. 4A and 4B, reference numerals 331 and 332 denote electrodes. Each area defined by the electrodes 331 and 332 forms one pixel. Characters "R", "G", and "B" in respective pixels represent colors of the color filter for the respective pixels. An "R" pixel transmits the red component of light, a "G" pixel transmits the green component of light, and a "B" pixel transmits the blue component of light.

For a color filter having a Bayer arrangement, one picture element is made up of an "R" pixel, a "B" pixel, and two "G" pixels. In the image sensor 108 of the embodiment, the second pixels capable of detecting the focus of the imaging lens 200 are assigned to some "G" pixels. Referring to FIGS. 4A and 4B, photo-electric conversion portions Pα1, Pβ1, Pα2, Pβ2, Pα3, and Pβ3 of pixels are used to detect the focus state of the imaging lens 200. In the embodiment, a smaller-area photo-electric conversion portion in one pixel is basically used for focus detection.

As focus detectable pixels arranged in part of the image sensor 108 of the embodiment, three types different in deviation amount between the optical axis of the microlens and the center of the photo-electric conversion portion are set to reduce the influence of eclipse of a focus detection beam arising from the manufacturing error of the image sensor 108.

In the plan views of the image sensor 108 of FIGS. 4A and 4B, the photo-electric conversion portion of a focus detectable pixel arranged on the first row and first column is divided by the light-shielding portion 313 and isolation portion 312 into the photo-electric conversion portion Pα1 and a photo-electric conversion portion Pγ1_1. The center of the smaller-area photo-electric conversion portion Pα1 deviates from the center of the pixel in the −x direction by the first deviation amount.

FIG. 6A is a view for explaining the light-receiving distribution of the pixel arranged on the first row and first column in the image sensor 108. The light-receiving distribution explanatory views of FIGS. 6A to 6F show distributions of receivable light quantity on the pupil of the imaging lens 200 in the absence of any manufacturing error of the image sensor 108. Referring to FIG. 6A, the monochrome gradation represents a receivable light quantity, and the light-receiving quantity is large in a white area.

The photo-electric conversion portion Pα1 of the pixel arranged on the first row and first column in the image sensor 108 can receive light from an area Sα1 on the pupil of the imaging lens 200. To the contrary, the photo-electric conversion portion Pγ1_1 can receive light from an area Sγ1_1 on the pupil of the imaging lens 200. Referring to FIG. 6A, the light-shielding portion 313 and isolation portion 312 which divide the photo-electric conversion portion generate an area with a small light-receiving quantity at a position spaced apart from the optical axis of the imaging lens 200 (intersection of the x- and y-axes in FIG. 6A) in the +x direction by a distance xα1.

In the plan views of the image sensor 108 of FIGS. 4A and 4B, a focus detectable pixel paired with the focus detectable pixel arranged on the first row and first column is arranged at a position (second row and second column in FIGS. 4A and 4B) adjacent in the diagonal direction. The paired focus detectable pixel is similarly divided by the light-shielding portion 313 and isolation portion 312 into the photo-electric conversion portion Pβ1 and a photo-electric conversion portion Pγ1_2. The center of the smaller-area photo-electric conversion portion Pβ1 deviates from the center of the pixel in the +x direction by the above-mentioned first deviation amount.

FIG. 6B is a view for explaining the light-receiving distribution of the pixel arranged on the second row and second column in the image sensor 108. Referring to FIG. 6B, the monochrome gradation represents a receivable light quantity, and the light-receiving quantity is large in a white area. The photo-electric conversion portion Pβ1 of the pixel arranged on the second row and second column in the image sensor 108 can receive light from an area Sβ1 on the pupil of the imaging lens 200. In contrast, the photo-electric conversion portion Pγ1_2 can receive light from an area Sγ1_2 on the pupil of the imaging lens 200. Referring to FIG. 6B, the light-shielding portion 313 and isolation portion 312 which divide the photo-electric conversion portion generate an area with a small light-receiving quantity at a position spaced apart from the optical axis of the imaging lens 200 (intersection of the x- and y-axes in FIG. 6B) in the −x direction by a distance xβ1. When the image sensor 108 has no manufacturing error, the distances xα1 and xβ1 of the pupil division portion where the light-receiving quantity decreases are equal to each other.

In the plan view of the image sensor 108 of FIG. 4A, a focus detectable pixel in which the light-shielding portion 313 and isolation portion 312 configured to divide the photo-electric conversion portion are located at a different position is arranged on a row (fifth row in FIG. 4A) spaced apart by four pixels in the −y direction. The photo-electric conversion portion of the focus detectable pixel arranged on the fifth row and first column is divided by the light-shielding portion 313 and isolation portion 312 into the photo-electric conversion portion Pα2 and a photo-electric conversion portion Pγ2_1. The center of the smaller-area photo-electric conversion portion Pα2 deviates from the center of the pixel in the −x direction by the second deviation amount different from the first deviation amount.

FIG. 6C is a view for explaining the light-receiving distribution of the pixel arranged on the fifth row and first column in the image sensor 108. Referring to FIG. 6C, the monochrome gradation represents a receivable light quantity, and the light-receiving quantity is large in a white area. The photo-electric conversion portion Pα2 of the pixel arranged on the fifth row and first column in the image sensor 108 can receive light from an area Sα2 on the pupil of the imaging lens 200. To the contrary, the photo-electric conversion portion Pγ2_1 can receive light from an area Sγ2_1 on the pupil of the imaging lens 200. Referring to FIG. 6C, the light-shielding portion 313 and isolation portion 312 which divide the photo-electric conversion portion generate an area with a small light-receiving quantity at a position spaced apart from the optical axis of the imaging lens 200 (intersection of the x- and y-axes in FIG. 6C) in the +x direction by a distance xα2.

In the plan view of the image sensor 108 of FIG. 4A, a focus detectable pixel paired with the focus detectable pixel arranged on the fifth row and first column is arranged at a position (sixth row and second column in FIG. 4A) adjacent in the diagonal direction. The paired focus detectable pixel is similarly divided by the light-shielding portion 313 and isolation portion 312 into the photo-electric conversion portion Pβ2 and a photo-electric conversion portion Pγ2_2. The center of the smaller-area photo-electric conversion portion Pβ2 deviates from the center of the pixel in the +x direction by the above-described second deviation amount.

FIG. 6D is a view for explaining the light-receiving distribution of the pixel arranged on the sixth row and second column in the image sensor 108. Referring to FIG. 6D, the monochrome gradation represents a receivable light quantity, and the light-receiving quantity is large in a white area. The photo-electric conversion portion Pβ2 of the pixel arranged on the sixth row and second column in the image sensor 108 can receive light from an area Sβ2 on the pupil of the imaging lens 200. In contrast, the photo-electric conversion portion Pγ2_2 can receive light from an area Sγ2_2 on the pupil of the imaging lens 200. Referring to FIG. 6D, the light-shielding portion 313 and isolation portion 312 which divide the photo-electric conversion portion generate an area with a small light-receiving quantity at a position spaced apart from the optical axis of the imaging lens 200 (intersection of the x- and y-axes in FIG. 6D) in the −x direction by a distance xβ2. When the image sensor 108 has no manufacturing error, the distances xα2 and xβ2 of the pupil division portion where the light-receiving quantity decreases are equal to each other.

In the plan view of the image sensor 108 of FIG. 4A, a focus detectable pixel in which the light-shielding portion 313 and isolation portion 312 configured to divide the photo-electric conversion portion are located at a different position is arranged on a row (ninth row in FIG. 4A) spaced apart by four pixels in the −y direction. The photo-electric conversion portion of the focus detectable pixel arranged on the ninth row and first column is divided by the light-shielding portion 313 and isolation portion 312 into the photo-electric conversion portion Pα3 and a photo-electric conversion portion Pγ3_1. The center of the smaller-area photo-electric conversion portion Pα3 deviates from the center of the pixel in the −x direction by the third deviation amount that is different from the first and second deviation amounts.

FIG. 6E is a view for explaining the light-receiving distribution of the pixel arranged on the ninth row and first column in the image sensor 108. Referring to FIG. 6E, the monochrome gradation represents a receivable light quantity, and the light-receiving quantity is large in a white area. The photo-electric conversion portion Pα3 of the pixel arranged on the ninth row and first column in the image sensor 108 can receive light from an area Sα3 on the pupil of the imaging lens 200. To the contrary, the photo-electric conversion portion Pγ3_1 can receive light from an area Sγ3_1 on the pupil of the imaging lens 200. Referring to FIG. 6E, the light-shielding portion 313 and isolation portion 312 which divide the photo-electric conversion portion generate an area with a small light-receiving quantity at a position spaced apart from the optical axis of the imaging lens 200 (intersection of the x- and y-axes in FIG. 6E) in the +x direction by a distance xα3.

In the plan view of the image sensor 108 of FIG. 4A, a focus detectable pixel paired with the focus detectable pixel arranged on the ninth row and first column is arranged at a position (10th row and second column in FIG. 4A) adjacent in the diagonal direction. The paired focus detectable pixel is similarly divided by the light-shielding portion 313 and isolation portion 312 into the photo-electric conversion portion Pβ3 and a photo-electric conversion portion Pγ3_2. The center of the smaller-area photo-electric conversion portion Pβ3 deviates from the center of the pixel in the +x direction by the above-mentioned third deviation amount.

FIG. 6F is a view for explaining the light-receiving distribution of the pixel arranged on the 10th row and second column in the image sensor 108. Referring to FIG. 6F, the monochrome gradation represents a receivable light quantity, and the light-receiving quantity is large in a white area. The photo-electric conversion portion Pβ3 of the pixel arranged on the 10th row and second column in the image sensor 108 can receive light from an area Sβ3 on the pupil of the imaging lens 200. In contrast, the photo-electric conversion portion Pγ3_2 can receive light from an area Sγ3_2 on the pupil of the imaging lens 200. Referring to FIG. 6F, the light-shielding portion 313 and isolation portion 312 which divide the photo-electric conversion portion generate an area with a small light-receiving quantity at a position spaced apart from the optical axis of the imaging lens 200 (intersection of the x- and y-axes in FIG. 6F) in the −x direction by a distance xβ3. When the image sensor 108 has no manufacturing error, the distances xα3 and xβ3 of the pupil division portion where the light-receiving quantity decreases are equal to each other.

Focus detectable pixels each having an identical photo-electric conversion portion Pα1 are arranged at positions spaced apart by every four pixels in the +x direction from the focus detectable pixel (first row and first column in FIGS. 4A and 4B) having the photo-electric conversion portion Pα1. Also, focus detectable pixels each having an identical photo-electric conversion portion Pβ1 are arranged at positions spaced apart by every four pixels in the +x direction from the focus detectable pixel (second row and second column in FIGS. 4A and 4B) having the photo-electric conversion portion Pβ1.

FIG. 7A shows a line image Iα1 generated by (output signals from) a pixel group having the photo-electric conversion portions Pα1 and a line image Iβ1 generated by a pixel group having the photo-electric conversion portions Pβ1. When detecting the focus state of the imaging lens 200, signals are output from the photo-electric conversion portions Pα1 of the focus detectable pixel group and the photo-electric conversion portions Pβ1 of the focus detectable pixel group.

Focus detectable pixels each having an identical photo-electric conversion portion Pα2 are arranged at positions spaced apart by every four pixels in the +x direction from the focus detectable pixel (fifth row and first column in FIG. 4A) having the photo-electric conversion portion Pα2. In the same manner, focus detectable pixels each having an identical photo-electric conversion portion Pβ2 are arranged at positions spaced apart by every four pixels in the +x direction from the focus detectable pixel (sixth row and second column in FIG. 4A) having the photo-electric conversion portion Pβ2.

FIG. 7B shows a line image Iα2 generated by a pixel group having the photo-electric conversion portions Pα2 and a line image Iβ2 generated by a pixel group having the photo-electric conversion portions Pβ2. When detecting the focus state of the imaging lens 200, signals are output from the photo-electric conversion portions Pα2 of the focus detectable pixel group and the photo-electric conversion portions Pβ2 of the focus detectable pixel group.

Focus detectable pixels each having an identical photo-electric conversion portion Pα3 are arranged at positions spaced apart by every four pixels in the +x direction from the focus detectable pixel (ninth row and first column in FIG. 4A) having the photo-electric conversion portion Pα3. Similarly, focus detectable pixels each having an identical photo-electric conversion portion Pβ3 are arranged at positions spaced apart by every four pixels in the +x direction from the focus detectable pixel (10th row and second column in FIG. 4A) having the photo-electric conversion portion Pβ3.

FIG. 7C shows a line image Iα3 generated by a pixel group having the photo-electric conversion portions Pα3 and a line image Iβ3 generated by a pixel group having the photo-electric conversion portions Pβ3. When detecting the focus state of the imaging lens 200, signals are output from the photo-electric conversion portions Pα3 of the focus detectable pixel group and the photo-electric conversion portions Pβ3 of the focus detectable pixel group.

As described above, the focus state of the imaging lens 200 is detected based on an image generated by outputs from only smaller-area photo-electric conversion portions in a focus detectable pixel group. In normal image capturing, an output from the undivided photo-electric conversion portion of the first pixel, and the sum of outputs from two divided photo-electric conversion portions of the second pixel are read out.

A case in which a normal captured image is acquired and a case in which a focus detection image is acquired will be explained with reference to the plan view of the image sensor 108 of FIG. 4B, the schematic circuit diagram of the image sensor 108 of FIG. 8, and the timing charts of FIGS. 9A to 9C.

In the plan view of the image sensor 108 of FIG. 4B, reference numeral 330 denotes a transfer electrode; and 314, a floating diffusion portion. The schematic circuit diagram of the image sensor 108 of FIG. 8 shows the circuit arrangement of four pixels shown in the plan view of the image sensor 108 of FIG. 4B.

Referring to FIG. 8, reference numeral 330 denotes a transfer switch MOS transistor. Each reset MOS transistor 360 resets the floating diffusion portion (to be referred to as an FD portion) 314 or the like to a predetermined potential. Each source follower amplifier MOS transistor 361 obtains an amplified signal based on charges transferred by the transfer switch MOS transistor 330. Each horizontal selection switch MOS transistor 362 selects a pixel from which an amplified signal obtained by the source follower amplifier MOS transistor 361 is to be read out. Each load MOS transistor 363 forms a source follower together with the source follower amplifier MOS transistor 361. Each dark output transfer MOS transistor 364 transfers a dark output from a pixel. Each bright output transfer MOS transistor 365 transfers a bright output from a pixel. Each dark output accumulation capacitor 371 accumulates a dark output transferred by the dark output transfer MOS transistor 364. Each bright output accumulation capacitor 370 accumulates a bright output transferred by the bright output transfer MOS transistor 365. Horizontal transfer MOS transistors 366 transfer respective outputs accumulated in the dark output accumulation capacitor 371 and bright output accumulation capacitor 370 to horizontal output lines. Horizontal output line reset MOS transistors 367 reset the horizontal output lines to predetermined potentials. A differential output amplifier 380 amplifies the difference between signals transferred to the respective horizontal output lines, and outputs the amplified difference. A horizontal scanning circuit 381 controls the ON/OFF operation of the horizontal transfer MOS transistor 366. A vertical scanning circuit 382 controls the ON/OFF operations of the transfer switch MOS transistor 330 and the like.

FIGS. 9A to 9C are timing charts showing the operation of the circuit of the image sensor 108 in FIG. 8. FIG. 9A is a timing chart of the 0th and first lines when acquiring a normal captured image. FIGS. 9B and 9C are timing charts of the 0th and first lines when acquiring a focus detection image.

An outline of acquiring a normal captured image will be explained. In an upper left pixel in the circuit diagram of the image sensor 108 of FIG. 8, charges converted by the photo-electric conversion portions 311_1 and 311_2 are simultaneously transferred to the FD portion 314, added by the FD portion 314, and then read out. At the same time, in an upper right pixel in FIG. 8, charges converted by the photo-electric conversion portion 311 are transferred to the FD portion 314 and read out.

A detailed operation in normal image capturing will be explained with reference to FIG. 9A. First, a control pulse $\phi S_0$ is switched to high level in synchronization with a timing output from the vertical scanning circuit 382 to turn on the horizontal selection switch MOS transistors 362 and select pixels on the 0th line.

Then, a control pulse $\phi R_0$ is switched to low level to stop resetting by the FD portions 314, float the FD portions 314, and enable the gate-source paths of the source follower amplifier MOS transistors 361. After a predetermined time, a control pulse φTN is temporarily switched to high level to output the dark voltages of the FD portions 314 to the dark output accumulation capacitors 371 by a source follower operation.

To output charges from the photo-electric conversion portions 311_1, 311_2, and 311 of the respective pixels on the 0th line, control pulses $\phi Tx_0$ and $\phi Taf_0$ are temporarily switched to high level to turn on the transfer switch MOS transistors 330_0 and 330_1.

At this time, charges converted by the photo-electric conversion portions 311_1 and 311_2 of the upper left pixel in the circuit diagram of FIG. 8 are transferred to the FD portion 314 and added. At the same time, charges converted by the photo-electric conversion portion 311 of the upper right pixel are transferred to the FD portion 314. That is, the photo-electric conversion portions 311_1 and 311_2 of the upper left pixel and the photo-electric conversion portion 311 of the upper right pixel are controlled integrally.

The charges transferred from the photo-electric conversion portions 311_1, 311_2, and 311 to the FD portions 314 change the potentials of the FD portions 314 in accordance with light. Since the source follower amplifier MOS transistors 361 float, the potentials of the FD portions 314 are output to the bright output accumulation capacitors 370 by temporarily switching a control pulse φTS to high level.

By then, dark and bright outputs from the respective pixels on the 0th line have been accumulated in the dark output accumulation capacitors 371 and bright output accumulation capacitors 370, respectively. Further, a control pulse φHC is temporarily switched to high level to turn on the horizontal output line reset MOS transistors 367 and reset the horizontal output lines.

In the horizontal transfer period, dark and bright outputs from the pixels on the 0th line are output to the horizontal output lines in synchronization with a scan timing signal from the horizontal scanning circuit 381 to the horizontal transfer MOS transistors 366.

At this time, the differential amplifier 380 amplifies the difference between signals from the dark output accumulation capacitors 371 and bright output accumulation capacitors 370, and provides an output Vout. Hence, a signal with high S/N ratio free from pixel random noise and fixed pattern noise can be obtained.

Thereafter, the control pulse φOR$_0$ is switched to high level, and the control pulse φS$_0$ is switched to low level, ending the selection of the pixels on the 0th line.

In the same fashion, the vertical scanning circuit 382 sequentially reads out charges from pixels on the next line, thereby outputting signals from all the pixels of the image sensor 108. The image processing circuit 154 performs signal processing for the output. The liquid crystal display element 109 displays the image, or the memory circuit 157 stores it.

An outline of detecting the focus state of the imaging lens 200 will be explained. To quickly read out an output from the second pixel capable of focus detection, outputs from the photo-electric conversion portions 311_1 of the upper left pixel and lower right pixel in the circuit diagram of the image sensor 108 of FIG. 8 are simultaneously acquired. The correlation between the two obtained images is calculated, and the focus state of the imaging lens 200 is detected from the image shift amount between the two images. At this time, outputs from the photo-electric conversion portions 311_2 and 311 not used to detect the focus state of the imaging lens 200 are not read out.

A detailed focus state detection operation will be described with reference to FIG. 9B. The control pulses φS$_0$ and φS$_1$ are switched to high level in synchronization with a timing output from the vertical scanning circuit 382 to turn on the horizontal selection switch MOS transistors 362 and select pixels on the 0th and first lines.

Then, the control pulses φR$_0$ and φR$_1$ are switched to low level to stop resetting by the FD portions 314, float the FD portions 314, and enable the gate-source paths of the source follower amplifier MOS transistors 361. After a predetermined time, the control pulse φTN is temporarily switched to high level to output the dark voltages of the FD portions 314 to the dark output accumulation capacitors 371 by a source follower operation.

The control pulses φTaf$_0$ and φTaf$_1$ are switched to high level to turn on the transfer switch MOS transistors 330_0 and 330_2. Charges converted by the photo-electric conversion portions 311_1 of the upper left pixel and lower right pixel in the circuit diagram of the image sensor 108 of FIG. 8 are simultaneously transferred to the FD portions 314.

At this time, the control pulses φTx$_0$ and φTx$_1$ are at low level, so photocharges in the photo-electric conversion portions 311_2 and 311 are not transferred to the FD portions 314.

The charges converted by the photo-electric conversion portions 311_1 are transferred to the FD portions 314, changing the potentials of the FD portions 314 in accordance with light. Since the source follower amplifier MOS transistors 361 float, the potentials of the FD portions 314 are output to the bright output accumulation capacitors 370 by temporarily switching the control pulse φTS to high level.

By then, dark and bright outputs from the second pixels capable of focus detection on the 0th and first lines have been accumulated in the dark output accumulation capacitors 371 and bright output accumulation capacitors 370, respectively. Further, the control pulse φHC is temporarily switched to high level to turn on the horizontal output line reset MOS transistors 367 and reset the horizontal output lines.

In the horizontal transfer period, dark and bright outputs from the second pixels capable of focus detection are output to the horizontal output lines in synchronization with a scan timing signal from the horizontal scanning circuit 381 to the horizontal transfer MOS transistors 366.

At this time, the differential amplifier 380 amplifies the difference between signals from the dark output accumulation capacitors 371 and bright output accumulation capacitors 370, and provides the output Vout. As a result, a signal with high S/N ratio free from pixel random noise and fixed pattern noise can be obtained.

After that, the control pulses φR$_0$ and φR$_1$ are switched to high level, and the control pulses φS$_0$ and φS$_1$ are switched to low level, ending the selection of the pixels on the 0th and first lines.

Similarly, the vertical scanning circuit 382 sequentially reads out charges from pixels on the next line, thereby outputting signals from all the focus detectable pixels of the image sensor 108.

The camera CPU 150 shapes an output from the image sensor 108 into a detection image signal by calculation. After correlation calculation processing, the focus state of the imaging lens 200 is calculated.

The above embodiment has described an example in which the focus state of the imaging lens 200 is detected using an output from the smaller-area photo-electric conversion portion 311_1 in the second pixel capable of focus detection. However, at low object brightness, it is also effective to perform focus detection using an output from the larger-area photo-electric conversion portion 311_2. A focus state detection operation at low object brightness will be described with reference to the timing chart of FIG. 9C.

First, the control pulse φS$_0$ is switched to high level in synchronization with a timing output from the vertical scanning circuit 382 to turn on the horizontal selection switch MOS transistors 362 and select pixels on the 0th line.

Then, the control pulse φR$_0$ is switched to low level to stop resetting by the FD portions 314, float the FD portions 314, and enable the gate-source paths of the source follower amplifier MOS transistors 361. After a predetermined time, the control pulse φTN is temporarily switched to high level to output the dark voltages of the FD portions 314 to the dark output accumulation capacitors 371 by a source follower operation.

The control pulse φTx$_0$ is switched to high level to turn on the transfer switch MOS transistors 330_1. Charges converted by the photo-electric conversion portion 311_2 of the upper left pixel and the photo-electric conversion portion 311 of the upper right pixel in the circuit diagram of the image sensor 108 of FIG. 8 are simultaneously transferred to the FD portions 314. At this time, the control pulse φTaf$_0$ is at low level, so photocharges in the smaller-area photo-electric conversion portion 311_1 are not transferred to the FD portion 314.

The charges converted by the photo-electric conversion portions 311_1 and 311 are transferred to the FD portions 314, changing the potentials of the FD portions 314 in accordance with light. Since the source follower amplifier MOS transistors 361 float, the potentials of the FD portions 314 are output to the bright output accumulation capacitors 370 by temporarily switching the control pulse φTS to high level.

By then, dark and bright outputs from the first pixel for normal capturing and the second pixel capable of focus detection on the 0th line have been accumulated in the dark output accumulation capacitors 371 and bright output accumulation capacitors 370, respectively. Further, the control pulse φHC is temporarily switched to high level to turn on the horizontal output line reset MOS transistors 367 and reset the horizontal output lines.

In the horizontal transfer period, dark and bright outputs from the focus detectable pixel are output to the horizontal output lines in synchronization with a scan timing signal from the horizontal scanning circuit 381 to the horizontal transfer MOS transistor 366.

At this time, the differential amplifier 380 amplifies the difference between signals from the dark output accumulation capacitors 371 and bright output accumulation capacitors 370, and provides the output Vout. A signal with high S/N ratio free from pixel random noise and fixed pattern noise can be obtained.

Thereafter, the control pulse φR$_0$ is switched to high level, and the control pulse φS$_0$ is switched to low level, ending the selection of the pixels on the 0th line.

To obtain a paired focus detection image signal, readout is done from a focus detectable pixel on the first line. First, the control pulse φS$_1$ is switched to high level in synchronization with a timing output from the vertical scanning circuit 382 to turn on the horizontal selection switch MOS transistors 362 and select pixels on the first line.

Then, the control pulse φR$_1$ is switched to low level to stop resetting by the FD portions 314, float the FD portions 314, and enable the gate-source paths of the source follower amplifier MOS transistors 361. After a predetermined time, the control pulse φTN is temporarily switched to high level to output the dark voltages of the FD portions 314 to the dark output accumulation capacitors 371 by a source follower operation.

The control pulse φTx$_1$ is switched to high level to turn on the transfer switch MOS transistors 330_3. Charges converted by the photo-electric conversion portion 311 of the lower left pixel and the photo-electric conversion portion 311_2 of the lower right pixel in the circuit diagram of the image sensor 108 of FIG. 8 are simultaneously transferred to the FD portions 314. At this time, the control pulse φTaf$_1$ is at low level, so photocharges in the smaller-area photo-electric conversion portion 311_1 are not transferred to the FD portion 314.

The charges converted by the photo-electric conversion portions 311_2 and 311 are transferred to the FD portions 314, changing the potentials of the FD portions 314 in accordance with light. Since the source follower amplifier MOS transistors 361 float, the potentials of the FD portions 314 are output to the bright output accumulation capacitors 370 by temporarily switching the control pulse φTS to high level.

By then, dark and bright outputs from the first pixel for normal capturing and the second pixel capable of focus detection on the first line have been accumulated in the dark output accumulation capacitors 371 and bright output accumulation capacitors 370, respectively. Further, the control pulse φHC is temporarily switched to high level to turn on the horizontal output line reset MOS transistors 367 and reset the horizontal output lines.

In the horizontal transfer period, dark and bright outputs from the focus detectable pixel are output to the horizontal output lines in synchronization with a scan timing signal from the horizontal scanning circuit 381 to the horizontal transfer MOS transistor 366.

At this time, the differential amplifier 380 amplifies the difference between signals from the dark output accumulation capacitors 371 and bright output accumulation capacitors 370, and provides the output Vout. A signal with high S/N ratio free from pixel random noise and fixed pattern noise can be obtained.

After that, the control pulse φR$_1$ is switched to high level, and the control pulse φS$_1$ is switched to low level, ending the selection of the pixels on the first line.

Similarly, the vertical scanning circuit 382 sequentially reads out charges from pixels on the next line, thereby outputting signals from all the pixels of the image sensor 108.

Since focus detection of the imaging lens 200 does not require an output the first pixel for normal capturing, the camera CPU 150 separates outputs from the image sensor 108 into a focus detection image signal and other image signals. The camera CPU 150 performs correlation calculation processing for the detected focus detection image signal to calculate the focus state of the imaging lens 200.

The embodiment has described an example in which the second pixels capable of focus detection are discretely arranged in "G" pixels in the Bayer arrangement. However, the second pixels capable of focus detection may be arranged in "B" pixels, "R" pixels, or pixels which do not absorb light.

Second Embodiment

Figure 10:
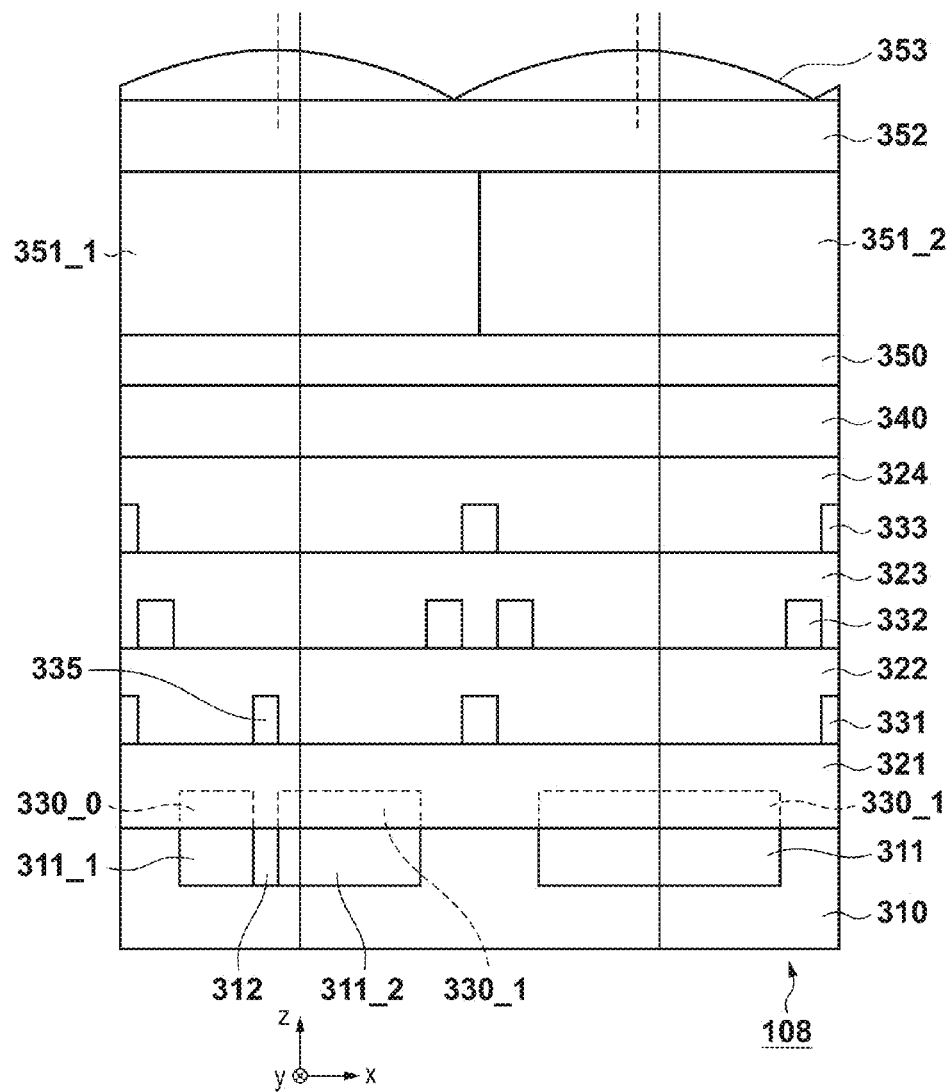
FIG. 10 is a partial sectional view showing an image sensor.
Figure 12A:
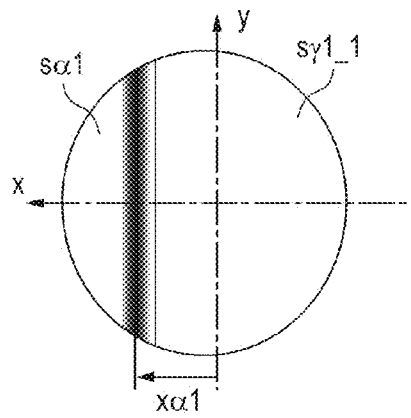
FIGS. 12A to 12F are views for explaining the light-receiving distribution of the image sensor.
Figure 12B:
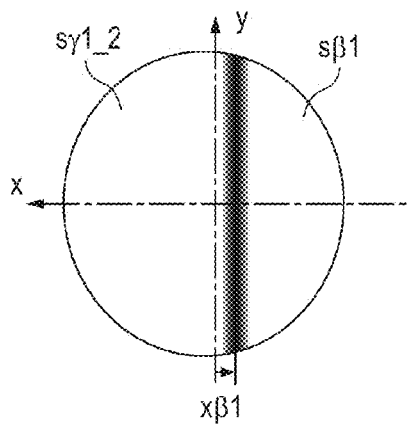
Figure 12C:
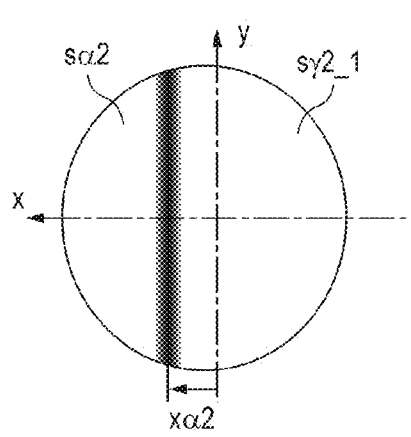
Figure 12D:
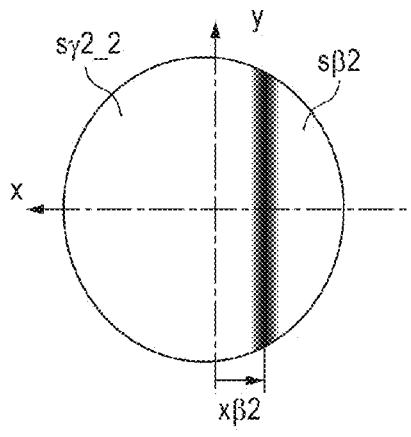
Figure 12E:
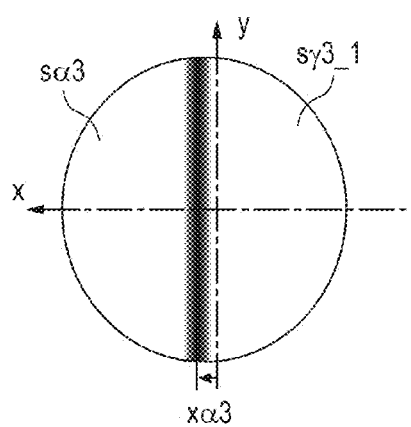
Figure 12F:
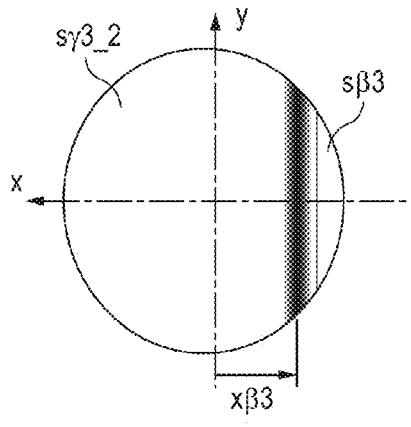
Figure 13A:
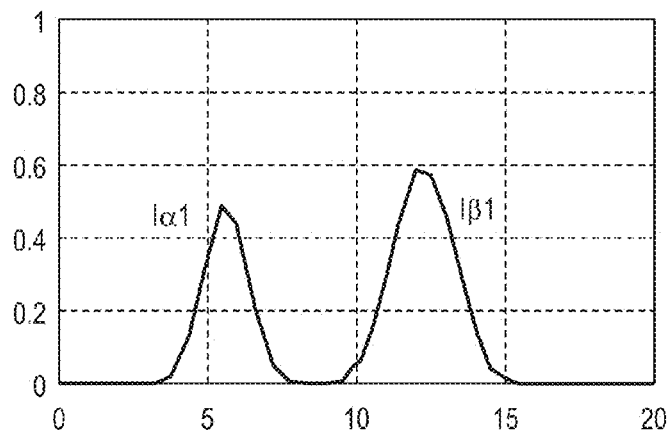
FIGS. 13A to 13C are graphs for explaining a line image obtained from the second pixel.
Figure 13B:
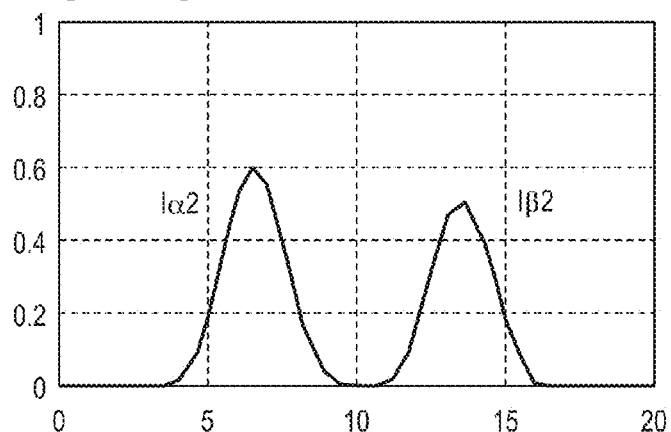
Figure 13C:
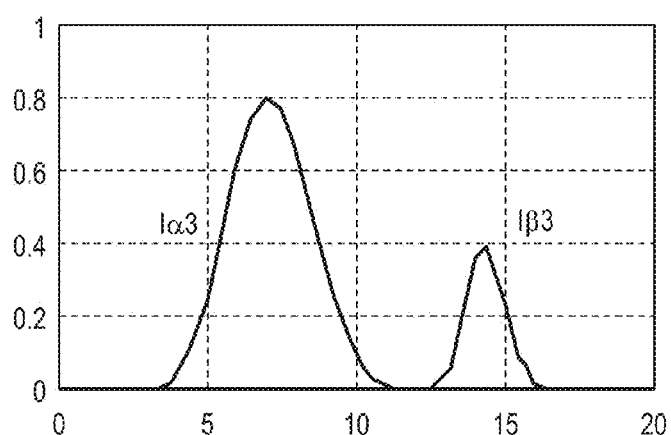

FIGS. 10 to 13C are views showing the second embodiment of the present invention, and show the structure of an image sensor at the periphery of the capturing screen of the camera and an obtained focus detection image. FIG. 10 is a partial sectional view showing a CMOS image sensor according to the embodiment. FIG. 11 is a partial plan view showing the image sensor. FIGS. 12A to 12F are views for explaining the light-receiving distribution of the image sensor. FIGS. 13A to 13C are graphs for explaining a line image. A camera in the second embodiment is identical to that in the first embodiment, and a description thereof will not be repeated. The same reference numerals as those in the first embodiment denote the same parts.

FIG. 10 is a sectional view showing pixels at the periphery of an image sensor 108. A pixel on the right side of FIG. 10 is the first pixel used in normal capturing, and a photo-electric conversion portion 311 is formed to be able to receive light in the entire pupil area of an imaging lens 200.

A pixel on the left side of FIG. 10 is the second pixel used in normal capturing and also used to detect the focus state of the imaging lens 200. The photo-electric conversion portion of the pixel on the left side of FIG. 10 includes an isolation portion 312 where an impurity opposite in polarity to the photo-electric conversion portion is diffused. The isolation portion 312 divides the photo-electric conversion portion into a smaller-area photo-electric conversion portion 311_1 and a larger-area photo-electric conversion portion 311_2 having a center at a position deviated from the optical axis of the microlens. The photo-electric conversion portions 311_1 and 311_2 can receive a beam having passed through part of the pupil of the imaging lens 200. The focus state of the imaging lens 200 is detected using an output from either the photo-electric conversion portion 311_1 or 311_2.

The photo-electric conversion portion of the pixel on the left side of FIG. 10 has almost the same area as that of the photo-electric conversion portion 311 of the pixel on the right side of FIG. 10. The sum of outputs from the photo-electric conversion portions 311_1 and 311_2 substantially equals an output from the photo-electric conversion portion 311 of the pixel on the right side of FIG. 10.

The sectional view of the image sensor 108 in FIG. 10 shows pixels positioned at the periphery of the image sensor 108. A microlens 353 deviates from the central axis of the pixel toward the optical axis (−x direction in FIG. 10) of an imaging lens (not shown). In the embodiment, a light-shielding portion 335 made of the same material as that of an electrode 331 is arranged on the light incident side of the isolation portion 312 to divide the photo-electric conversion portion into the photo-electric conversion portions 311_1 and 311_2.

FIG. 11 is a plan view showing the pixel arrangement of the image sensor 108. Referring to FIG. 11, reference numerals 331 and 332 denote electrodes. Each area defined by the electrodes 331 and 332 forms one pixel. Characters "R", "G", and "B" in respective pixels represent colors of the color filter for the respective pixels. An "R" pixel transmits the red component of light, a "G" pixel transmits the green component of light, and a "B" pixel transmits the blue component of light.

For a color filter having a Bayer arrangement, one picture element is made up of an "R" pixel, a "B" pixel, and two "G" pixels. In the image sensor 108 of the embodiment, the second pixels capable of detecting the focus of the imaging lens 200 are assigned to some "G" pixels. Referring to FIG. 11, photo-electric conversion portions Pα1, Pβ1, Pα2, Pβ2, Pα3, and Pβ3 of pixels are used to detect the focus state of the imaging lens 200. In the embodiment, a smaller-area photo-electric conversion portion in one pixel is basically used for focus detection.

As focus detectable pixels arranged in part of the image sensor 108 of the embodiment, three types different in deviation amount between the optical axis of the microlens and the center of the photo-electric conversion portion are set to reduce the influence of eclipse of a focus detection beam arising from the manufacturing error of the image sensor 108.

In the plan view of the image sensor 108 of FIG. 11, the photo-electric conversion portion of a focus detectable pixel arranged on the first row and first column is divided by the light-shielding portion 335 and isolation portion 312 into the photo-electric conversion portion Pα1 and a photo-electric conversion portion Pγ1_1. The center of the smaller-area photo-electric conversion portion Pα1 deviates from the center of the pixel in the −x direction by the first deviation amount.

FIG. 12A is a view for explaining the light-receiving distribution of the pixel arranged on the first row and first column in the image sensor 108. The light-receiving distribution explanatory views of FIGS. 12A to 12F show receivable light quantity distributions on the pupil of the imaging lens 200 in the absence of any manufacturing error of the image sensor 108. Referring to FIG. 12A, the monochrome gradation represents a receivable light quantity, and the light-receiving quantity is large in a white area. The light receivable area is not circular because of vignetting by the lens frame of the imaging lens 200.

The photo-electric conversion portion Pα1 of the pixel arranged on the first row and first column in the image sensor 108 can receive light from an area Sγ1 on the pupil of the imaging lens 200. To the contrary, the photo-electric conversion portion Pγ1_1 can receive light from an area Sγ_1 on the pupil of the imaging lens 200. Referring to FIG. 12A, the light-shielding portion 335 and isolation portion 312 which divide the photo-electric conversion portion generate an area with a small light-receiving quantity at a position spaced apart from the optical axis of the imaging lens 200 (intersection of the x- and y-axes in FIG. 12A) in the +x direction by a distance xα1.

In the plan view of the image sensor 108 of FIG. 11, a focus detectable pixel paired with the focus detectable pixel arranged on the first row and first column is arranged at a position (second row and second column in FIG. 11) adjacent in the diagonal direction. The paired focus detectable pixel is similarly divided by the light-shielding portion 335 and isolation portion 312 into the photo-electric conversion portion Pβ1 and a photo-electric conversion portion Pγ1_2. The center of the smaller-area photo-electric conversion portion Pβ1 deviates from the center of the pixel in the +x direction by the above-mentioned first deviation amount.

FIG. 12B is a view for explaining the light-receiving distribution of the pixel arranged on the second row and second column in the image sensor 108. Referring to FIG. 12B, the monochrome gradation represents a receivable light quantity, and the light-receiving quantity is large in a white area.

The photo-electric conversion portion Pβ1 of the pixel arranged on the second row and second column in the image sensor 108 can receive light from an area Sβ1 on the pupil of the imaging lens 200. In contrast, the photo-electric conversion portion Pγ1_2 can receive light from an area Sγ_2 on the pupil of the imaging lens 200. Referring to FIG. 12B, the light-shielding portion 335 and isolation portion 312 which divide the photo-electric conversion portion generate an area with a small light-receiving quantity at a position spaced apart from the optical axis of the imaging lens 200 (intersection of the x- and y-axes in FIG. 12B) in the −x direction by a distance xβ1.

In the plan view of the image sensor 108 of FIG. 11, a focus detectable pixel in which the light-shielding portion 335 and isolation portion 312 configured to divide the photo-electric conversion portion are located at a different position is arranged on a row (fifth row in FIG. 11) spaced apart by four pixels in the −y direction. The photo-electric conversion portion of the focus detectable pixel arranged on the fifth row and first column is divided by the light-shielding portion 335 and isolation portion 312 into the photo-electric conversion portion Pα2 and a photo-electric conversion portion Pγ2_1. The center of the smaller-area photo-electric conversion portion Pα2 deviates from the center of the pixel in the −x direction by the second deviation amount different from the first deviation amount.

FIG. 12C is a view for explaining the light-receiving distribution of the pixel arranged on the fifth row and first column in the image sensor 108. Referring to FIG. 12C, the monochrome gradation represents a receivable light quantity, and the light-receiving quantity is large in a white area. The photo-electric conversion portion Pα2 of the pixel arranged on the fifth row and first column in the image sensor 108 can receive light from an area Sα2 on the pupil of the imaging lens 200. To the contrary, the photo-electric conversion portion Pγ2_1 can receive light from an area Sγ2_1 on the pupil of the imaging lens 200. Referring to FIG. 12C, the light-shielding portion 335 and isolation portion 312 which divide the photo-electric conversion portion generate an area with a small light-receiving quantity at a position spaced apart from the optical axis of the imaging lens 200 (intersection of the x- and y-axes in FIG. 12C) in the +x direction by a distance xα2.

In the plan view of the image sensor 108 of FIG. 11, a focus detectable pixel paired with the focus detectable pixel arranged on the fifth row and first column is arranged at a position (sixth row and second column in FIG. 11) adjacent in the diagonal direction. The paired focus detectable pixel is similarly divided by the light-shielding portion 335 and isolation portion 312 into the photo-electric conversion portion Pβ2 and a photo-electric conversion portion Pγ2_2. The center of the smaller-area photo-electric conversion portion Pβ2 deviates from the center of the pixel in the +x direction by the above-described second deviation amount.

FIG. 12D is a view for explaining the light-receiving distribution of the pixel arranged on the sixth row and second column in the image sensor 108. Referring to FIG. 12D, the monochrome gradation represents a receivable light quantity, and the light-receiving quantity is large in a white area. The photo-electric conversion portion Pβ2 of the pixel arranged on the sixth row and second column in the image sensor 108 can receive light from an area Sβ2 on the pupil of the imaging lens 200. In contrast, the photo-electric conversion portion Pγ2_2 can receive light from an area Sγ2_2 on the pupil of the imaging lens 200. Referring to FIG. 12D, the light-shielding portion 335 and isolation portion 312 which divide the photo-electric conversion portion generate an area with a small light-receiving quantity at a position spaced apart from the optical axis of the imaging lens 200 (intersection of the x- and y-axes in FIG. 12D) in the −x direction by a distance xβ2.

In the plan view of the image sensor 108 of FIG. 11, a focus detectable pixel in which the light-shielding portion 335 and isolation portion 312 configured to divide the photo-electric conversion portion are located at a different position is arranged on a row (ninth row in FIG. 11) spaced apart by four pixels in the −y direction. The photo-electric conversion portion of the focus detectable pixel arranged on the ninth row and first column is divided by the light-shielding portion 335 and isolation portion 312 into the photo-electric conversion portion Pα3 and a photo-electric conversion portion Pγ3_1. The center of the smaller-area photo-electric conversion portion Pα3 deviates from the center of the pixel in the −x direction by the third deviation amount different from the first and second deviation amounts.

FIG. 12E is a view for explaining the light-receiving distribution of the pixel arranged on the ninth row and first column in the image sensor 108. Referring to FIG. 12E, the monochrome gradation represents a receivable light quantity, and the light-receiving quantity is large in a white area. The photo-electric conversion portion Pα3 of the pixel arranged on the ninth row and first column in the image sensor 108 can receive light from an area Sα3 on the pupil of the imaging lens 200. To the contrary, the photo-electric conversion portion Pγ3_1 can receive light from an area Sγ3_1 on the pupil of the imaging lens 200. Referring to FIG. 12E, the light-shielding portion 335 and isolation portion 312 which divide the photo-electric conversion portion generate an area with a small light-receiving quantity at a position spaced apart from the optical axis of the imaging lens 200 (intersection of the x- and y-axes in FIG. 12E) in the +x direction by a distance xα3.

In the plan view of the image sensor 108 of FIG. 11, a focus detectable pixel paired with the focus detectable pixel arranged on the ninth row and first column is arranged at a position (10th row and second column in FIG. 11) adjacent in the diagonal direction. The paired focus detectable pixel is similarly divided by the light-shielding portion 335 and isolation portion 312 into the photo-electric conversion portion Pβ3 and a photo-electric conversion portion Pγ3_2. The center of the smaller-area photo-electric conversion portion Pβ3 deviates from the center of the pixel in the +x direction by the above-mentioned third deviation amount.

FIG. 12F is a view for explaining the light-receiving distribution of the pixel arranged on the 10th row and second column in the image sensor 108. Referring to FIG. 12F, the monochrome gradation represents a receivable light quantity, and the light-receiving quantity is large in a white area. The photo-electric conversion portion Pβ33 of the pixel arranged on the 10th row and second column in the image sensor 108 can receive light from an area Sβ3 on the pupil of the imaging lens 200. In contrast, the photo-electric conversion portion Pγ3_2 can receive light from an area Sγ3_2 on the pupil of the imaging lens 200. Referring to FIG. 12F, the light-shielding portion 335 and isolation portion 312 which divide the photo-electric conversion portion generate an area with a small light-receiving quantity at a position spaced apart from the optical axis of the imaging lens 200 (intersection of the x- and y-axes in FIG. 12F) in the −x direction by a distance xβ3.

Focus detectable pixels each having an identical photo-electric conversion portion Pα1 are arranged at positions spaced apart by every four pixels in the +x direction from the focus detectable pixel (first row and first column in FIG. 11) having the photo-electric conversion portion Pα1.

Also, focus detectable pixels each having an identical photo-electric conversion portion Pβ1 are arranged at positions spaced apart by every four pixels in the +x direction from the focus detectable pixel (second row and second column in FIG. 11) having the photo-electric conversion portion Pβ1.

FIG. 13A shows a line image Iα1 generated by a pixel group having the photo-electric conversion portions Pα1 and a line image Iβ1 generated by a pixel group having the photo-electric conversion portions Pβ1. When detecting the focus state of the imaging lens 200, signals are output from the photo-electric conversion portions Pα1 of the focus detectable pixel group and the photo-electric conversion portions Pβ1 of the focus detectable pixel group.

Focus detectable pixels each having an identical photo-electric conversion portion Pα2 are arranged at positions spaced apart by every four pixels in the +x direction from the focus detectable pixel (fifth row and first column in FIG. 11) having the photo-electric conversion portion Pα2.

In the same way, focus detectable pixels each having an identical photo-electric conversion portion Pβ2 are arranged at positions spaced apart by every four pixels in the +x direction from the focus detectable pixel (sixth row and second column in FIG. 11) having the photo-electric conversion portion Pβ2.

FIG. 13B shows a line image Iα2 generated by a pixel group having the photo-electric conversion portions Pα2 and a line image Iβ2 generated by a pixel group having the photo-electric conversion portions Pβ2. When detecting the focus state of the imaging lens 200, signals are output from the photo-electric conversion portions Pα2 of the focus detectable pixel group and the photo-electric conversion portions Pβ2 of the focus detectable pixel group.

Focus detectable pixels each having an identical photo-electric conversion portion Pα3 are arranged at positions spaced apart by every four pixels in the +x direction from the focus detectable pixel (ninth row and first column in FIG. 11) having the photo-electric conversion portion Pα3.

Similarly, focus detectable pixels each having an identical photo-electric conversion portion Pβ3 are arranged at positions spaced apart by every four pixels in the +x direction from the focus detectable pixel (10th row and second column in FIG. 11) having the photo-electric conversion portion Pβ3.

FIG. 13C shows a line image Iα3 generated by a pixel group having the photo-electric conversion portions Pα3 and a line image Iβ3 generated by a pixel group having the photo-electric conversion portions Pβ3. When detecting the focus state of the imaging lens 200, signals are output from the photo-electric conversion portions Pα3 of the focus detectable pixel group and the photo-electric conversion portions Pβ3 of the focus detectable pixel group.

As is apparent from the light-receiving distribution explanatory views of FIGS. 12E and 12F, the pupil area Sα3 from which the photo-electric conversion portion Pα3 can receive light greatly differs from the pupil area Sβ3 from which the photo-electric conversion portion Pβ3 can receive light. This results in a great output difference between the line image Iα3 generated by a pixel group having the photo-electric conversion portions Pα3 and the line image Iβ3 generated by a pixel group having the photo-electric conversion portions Pβ3. In the embodiment, an output from the pixel group having the photo-electric conversion portions Pα3 and that from the pixel group having the photo-electric conversion portions Pβ3 are not used for focus detection because of poor correlation between a focus detection image generated by the pixel group having the photo-electric conversion portions Pα3 and a focus detection image generated by the pixel group having the photo-electric conversion portions Pβ3.

As described above, the focus state of the imaging lens 200 is detected using signals from only smaller-area photo-electric conversion portions in a focus detectable pixel group when the output difference between generated paired images is small. In normal image capturing, an output from the undivided photo-electric conversion portion of the first pixel, and the sum of outputs from two divided photo-electric conversion portions of the second pixel are read out.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-179000, filed Aug. 9, 2010, which is hereby incorporated by reference herein in its entirety.

The invention claimed is:

1. An image capture apparatus comprising:
an image sensor which photo-electrically converts an object image formed by an imaging lens, the image sensor including a first pixel group having a first light-receiving area, and a second pixel group which is configured by dividing a light-receiving area into a second light-receiving area and a third light-receiving area different in area from the second light-receiving area; and
a control unit configured to control the second and third light-receiving areas of the second pixel group and the first light-receiving area of the first pixel group of a same line by a same timing in an image capturing operation and configured to control the third light receiving areas of the second pixel group of different lines by a same timing in a detection operation of a focus state of the imaging lens.

2. The apparatus according to claim 1, wherein the image sensor includes a color filter with a Bayer arrangement, and the second pixel group is arranged at positions of two green pixels forming the Bayer arrangement.

3. The apparatus according to claim 2, wherein the control unit controls the third light-receiving area of one pixel in the second pixel group and the third light-receiving area of another pixel in the second pixel group that is arranged adjacent to the one pixel by the same timing.

4. The apparatus according to claim 1, further comprising a focus detection unit configured to detect the focus state of the imaging lens based on an output signal from the third light-receiving area of the second pixel group of the image sensor.

5. The apparatus according to claim 1, wherein the second pixel group is discretely disposed within the first pixel group.

6. The apparatus according to claim 1, wherein the second pixel group is configured by dividing the light-receiving area substantially equal in area to the first light-receiving area into the second light-receiving area and the third light-receiving area.

* * * * *